United States Patent
Tamesue et al.

(10) Patent No.: US 6,320,389 B1
(45) Date of Patent: Nov. 20, 2001

(54) ELECTRIC LEAK DETECTING APPARATUS FOR ELECTRIC MOTORCARS

(75) Inventors: Kazuhiko Tamesue, Iizuka; Masahiro Takada, Toyohashi; Kunio Kanamaru, Okazaki, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/183,297

(22) Filed: Oct. 30, 1998

(30) Foreign Application Priority Data

Oct. 30, 1997 (JP) .................................................. 9-299161

(51) Int. Cl.⁷ .................................................. G01R 27/00
(52) U.S. Cl. ........................................ 324/509; 324/76.11
(58) Field of Search ............................. 324/509, 603, 324/605, 649, 676, 76.11

(56) References Cited

U.S. PATENT DOCUMENTS

| | | |
|---|---|---|
| 4,458,196 | 7/1984 | Goyal et al. . |
| 4,570,116 | * 2/1986 | Tedd et al. ........................... 324/649 |
| 4,721,957 | * 1/1988 | Buttle ............................. 324/76.11 X |

FOREIGN PATENT DOCUMENTS

| | | |
|---|---|---|
| 279 958 | 6/1990 | (DE) . |
| 0 605 997 | 7/1994 | (EP) . |
| 0 751 396 | 1/1997 | (EP) . |
| 2 700 208 | 7/1994 | (FR) . |
| 2 721 407 | 12/1995 | (FR) . |
| 57-119263 | 7/1982 | (JP) . |
| 60-262069 | 12/1985 | (JP) . |

OTHER PUBLICATIONS

European Search Report corresponding to application No. EP 98 12 0566 dated Apr. 25, 2000.

* cited by examiner

*Primary Examiner*—Safet Metjahic
*Assistant Examiner*—T. R. Sundaram
(74) *Attorney, Agent, or Firm*—Ratner & Prestia

(57) ABSTRACT

An electric leak detecting apparatus used for an electric motorcar includes a source for generating an AC signal, which supplies a sine wave detecting signal S1 of a single frequency f1 Hz to between a vehicle body and a low potential side or a high potential side of a battery pack, a condenser having capacitance Cd for insulating the AC source from the low potential side or high potential side of the battery pack with respect to direct currents and for connecting the AC source to the low or high potential side of the battery pack with respect to alternating currents. Also included are a voltage detecting circuit for detecting an AC signal voltage of the detecting signal S1 at either side of the condenser, a current detecting circuit for detecting an AC signal current of the detecting signal S1, an admittance detecting circuit for computing an electric leak admittance $|Y|$ from the AC signal voltage and AC signal current of the detecting signal S1, a phase discriminating circuit for finding a phase difference between the AC signal voltage and AC signal current of the detecting signal S1, a resistance component detector for detecting a resistance component by computing a real part of the admittance $|Y|$ from the admittance and phase difference. Also included is a comparison device for comparing the resistance component to a threshold value.

24 Claims, 33 Drawing Sheets

RELATIONSHIP BETWEEN PHASE
DIFFERENCE $\phi$ AND INTEGRATION
VOLTAGE $V_\phi$

ELECTRIC LEAK RESISTANCE Rleak CHARACTERISTICs
OF PHASE DISCRIMINATING CIRCUIT AT CD=1Uf, Cs=0.1Uf

ELECTRIC LEAK DETECTING APPARATUS FOR ELECTRIC MOTORCARS

BACKGROUND OF THE INVENTION

1. Field of the Invention

The present invention relates to an electric leak detecting apparatus and method for detecting an electric leak caused by deteriorated insulation between vehicle body and battery pack in an electric motorcar provided with a high voltage battery pack insulated from the vehicle body electrically to prevent electrical shocks.

2. Description of the Related Art

An electric motorcar, which uses an electric power as its driving source, is provided with a battery pack composed as a closed circuit and separated from the vehicle body. The battery pack functions as a ground to prevent electric shocks to be caused by a high voltage set battery used as a driving power source. If the insulating characteristics of the battery pack are deteriorated due to a change of the material quality thereof and/or deposit thereon, however, the high voltage battery pack is connected electrically to the vehicle body. And, this may cause a person to have an electric shock when he/she touches the vehicle body. Because, a leak current from the battery pack flows through him/her body.

An electric leak is a sum of leak currents flowing in all insulated portions. It is thus difficult to identify a system in which the current flows through. In order to detect such an electric leak, there have been proposed two methods so far; an AC method, which detects an electric leak resistance by applying an AC signal to an object vehicle body insulated from direct currents by a condenser and a transformer, and a non-insulating DC method, which measures an electric leak resistance as a direct current without using any of the condenser and the transformer. For example, the official report of Unexamined Published Japanese Patent Application No.57-119263 has disclosed an embodiment that adopts the AC method that uses a transformer and the official report of Unexamined Published Japanese Patent Application No.60-262069 has disclosed an embodiment that adopts the DC method.

FIG. 20 shows an equivalent circuit from which an electric leak is detected. Usually, an electric leak should be modeled with a distributed constant concept. If it is taken into consideration that a current leaks from the potential node of every set battery, however, the equivalent circuit of the battery pack 3 is represented by the set battery 3$a$ and an electric leak admittance 3$b$ noted by a concentrated constant using a resistor and a condenser. In FIG. 20, I0 to In are leak currents, each flowing from a node to the vehicle body. The sum I of the leak currents is thus equal to the sum of the currents I0 to In because of the superposition theory of currents.

[Equation 1]

$$I = I_0 + I_1 + \Lambda + I_{n-1} + I_n = \sum_{m=1}^{n} I_m$$

If the admittance in a battery is so low that it may be ignored, the admittance between the vehicle ground and the set battery 3$a$ can be represented as the sum of admittance elements.

[Equation 2]

$$\begin{cases} Y_{LEAK} = Y_0 + \Lambda + Y_n = G_{LEAK} + j\omega C_s = \dfrac{1}{R_{LEAK}} + j\omega C_s \\ \Theta G_{LEAK} = \dfrac{1}{R_{LEAK}} = \dfrac{1}{R_0} + \Lambda + \dfrac{1}{R_n} \\ \Theta C_S = C_0 + \Lambda + C_n \end{cases}$$

And, the battery pack 3 shown in FIG. 20 can further be simplified as an AC equivalent circuit as shown in FIG. 21.

The AC method, when used for detecting electric leaks, is characterized as follows:

(1) Since the object is insulated, no DC current flows in the object. The method is thus excellent in the aspect of safety.

(2) An admittance to be detected includes a floating capacitance of the object vehicle. The admittance thus includes an error.

(3) Although a lower frequency AC signal is advantageous to improve the electric leak detecting accuracy. However, the use of such a lower frequency deteriorates the responsiveness. In addition, the input condenser must be expanded more in size.

(4) Detected values are apt to be affected and varied by the floating capacitance of the object vehicle. In addition, the floating capacitance is also changed according to the external shape of the vehicle, so it is difficult to decide a criterion for electric leaks.

For example, if a conventional configuration as shown in FIG. 22 is taken for the AC method, an electric leak resistance is found as an absolute value of admittance. As shown in the vector in FIG. 23, therefore, an admittance absolute value |YLEAK| is used in place of an electric leak resistance for convenience sake. Refer to Equation 3.

[Equation 3]

$$|Y| = \frac{|i|}{|v|}$$

In the above case, however, the electric leak judgment will include an error due to the floating capacitance Cs. In order to reduce the influence of the floating capacitance Cs thereby to improve the measuring accuracy, the phase angle ø must be reduced. And, the detecting signal frequency must be lowered to reduce the phase angle ø.

On the other hand, the DC method can solve the problems caused by the AC method described in (1) to (4). The AC method, however, cannot solve a problem that the measuring accuracy is still low due to an error of the electric leak resistance of the battery pack itself. Further there is such problem that the detection side and driving side are connected with direct current on account of the detection.

SUMMARY OF THE INVENTION

Under such circumstances, it is an object of the present invention to solve the above problems the related art of AC and DC methods have been confronted with. It is an object of the present invention to provide an electric leak detecting apparatus excellent in safety and enabling constant detection so as to solve the problems of the related art AC method by applying an AC signal to the high voltage battery pack, then finding an admittance from the relationship between amplitude and phase of the AC signal, and further finding a resistance component, which is an inverse number of the admittance resistance component, from the cosine of the phase angle.

It is possible to use an impedance Z to represent such an electric leak, but an admittance will be easier to represent in such an electric leak expression. Therefore, an electric leak will be described with an admittance and an inverse of resistance (conductance).

Of course, it is also possible to judge an electric leak with the real part of an admittance, that is, an inverse of resistance.

It is also another object of the present invention to provide an electric leak detecting apparatus and a system provided with such an electric leak detecting apparatus so as to solve the related art problems of the DC method. In this case, the influences of the voltage of the set battery, as well as the admittance capacitance component are eliminated from the electric leak detecting apparatus by finding a DC current applied to a node of the set battery from an external DC power source, then finding a DC current when the polarity of the DC power source is reversed and finding an electric leak resistance form the difference between those DC currents.

In order to solve the above problems, the AC method of the present invention is characterized by that a resistance component is found from an electric leak admittance using an electric leak detecting method that uses a very safe AC signal thereby to correct the capacitance component of the vehicle body for accurate electric leak judgments.

On the other hand, the DC method of the present invention is characterized by that the electric leak detecting apparatus provided with a high measuring accuracy is used to apply a DC voltage to an insulating object positively and measure the DC current with respect to both maximum and minimum potential nodes of the set battery, then compute an electric leak resistance from the difference between those currents and said DC voltage.

As described above, according to the present invention, an AC signal can be used to safely detect an electric leak resistance. Since there is no need to use a lower frequency to improve the detection accuracy, any frequency easy to handle can be used. It is thus possible to improve the responsiveness and reduce the size of the electric leak detecting apparatus.

Furthermore, an electric leak resistance can be found easily from a difference between the currents obtained when a potential is applied from a DC power source to the maximum or minimum potential of the set battery and the polarity of the DC power source when changed. There is no need to use the voltage of the set battery to find the electric leak resistance.

DESCRIPTION OF NUMERALS

1 . . . AC SIGNAL SOURCE
2 . . . CONDENSER
3 . . . BATTERY PACK
3-ac . . . BATTERY PACK COMPOSED OF AN AC EQUIVALENT CIRCUIT
3a . . . SET BATTERY
3b . . . ELECTRIC LEAK ADMITTANCE
3b-2 . . . AC EQUIVALENT CIRCUIT OF ELECTRIC LEAK ADMITTANCE WHEN IMPEDANCE INSIDE THE BATTERY IS IGNORED
4 . . . PHASE DISCRIMINATING MEANS
4a . . . WAVEFORM RECTIFYING MEANS
4a-1 . . . COMPARATOR
4a-2 . . . RESISTOR
4b . . . EXCLUSIVE-OR CIRCUIT
4c . . . INTEGRATION CIRCUIT
4d . . . MULTIPLIER
4e . . . INTEGRATION CIRCUIT
4f . . . TIMING GENERATING MEANS
4g . . . SAMPLING & HOLDING MEANS
5 . . . ADMITTANCE DETECTING MEANS
5a . . . EFFECTIVE VALUE CHANGING MEANS
5b . . . DIVIDING MEANS
5c . . . PEAK DETECTING MEANS
6 . . . ELECTRIC LEAK JUDGING MEANS
6a . . . RESISTANCE COMPONENT COMPUTING MEANS
6a-1 . . . VOLTAGE-COSINE CONVERTING MEANS
6a-2 . . . MULTIPLYING MEANS
6b . . . COMPARING MEANS
6c . . . Vf→ tanϕ CONVERTING MEANS
6d . . . RESISTANCE COMPONENT COMPUTING MEANS 2
6e . . . RESISTANCE DETECTION MEANS
9 . . . CURRENT DETECTING MEANS
11 . . . DC VOLTAGE SOURCE
12 . . . POLARITY SELECT SWITCH
13 . . . DC CURRENT DETECTING MEANS
14 . . . RESISTOR
15 . . . FLOATING CAPACITY COMPUTING MEANS
15a . . . PEAK HOLD
15b . . . Cs ESTIMATING MEANS
16 . . . INSULATION AMPLIFYING MEANS

DESCRIPTION OF THE PREFERRED EMBODIMENTS

Hereunder, preferred embodiments of the present invention will be described with reference to accompanying drawings.

Figure 1:
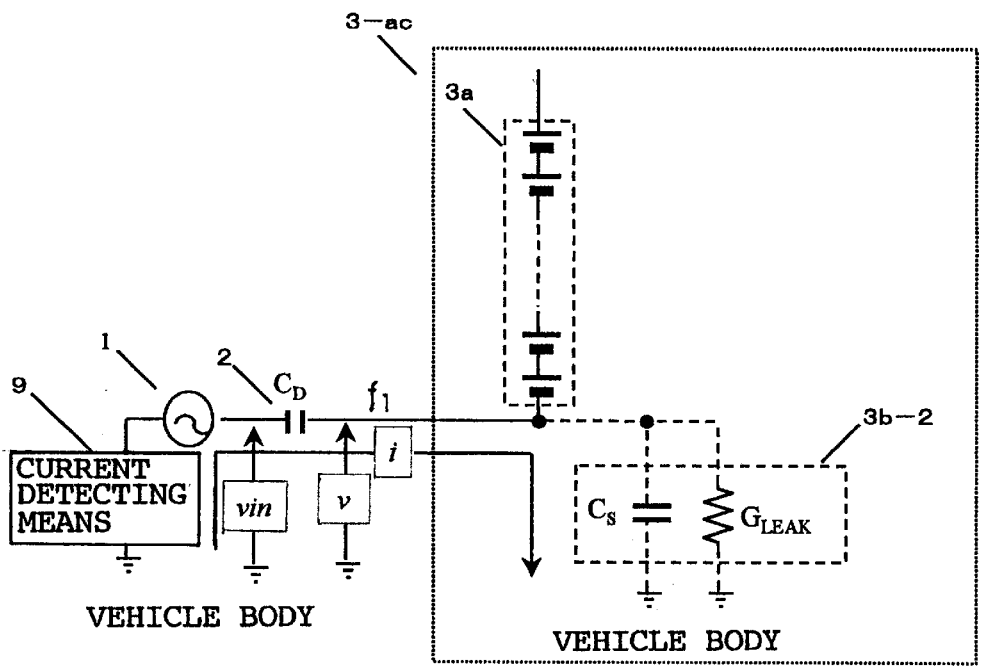
FIG. 1 illustrates a principle for a configuration of an electric leak detecting apparatus of the present invention, which uses an AC method.
Figure 1:
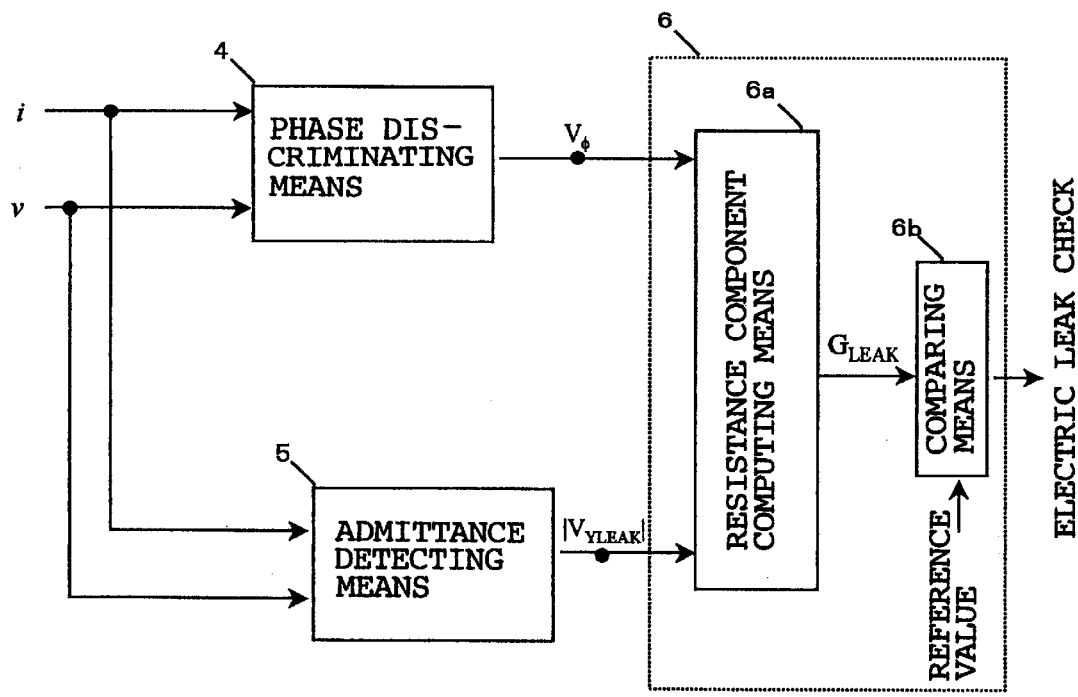

FIG. 1 is a block diagram of an electric leak detecting apparatus of the present invention. At first, the components of the apparatus will be described.

1 is an AC signal source used to generate an AC signal. 2 is a condenser used to insulate an electric leak detecting circuit from a battery pack 3-ac and supply an AC voltage to the battery pack 3-ac. The battery pack 3-ac is composed of an AC equivalent circuit. 3a is a high voltage Bet battery and 3b is an electric leak admittance noted by a concentrated parameter representation between the battery pack and the vehicle body. 4 is phase discriminating means for converting a phase difference between the AC current i of the AC signal source 1 and the AC voltage v to a voltage Vϕ. 5 is admittance detecting means for outputting a voltage |VYLEAK|, equivalent to an electric leak admittance, obtained from the AC current i flowing in the condenser 2 and the AC voltage of the AC signal source 1. 6 is electric leak judging means composed of resistance component computing means 6a and comparing means 6b. A real part of an admittance, that is an electric leak resistance component is obtained from the voltage Vϕ equivalent to a phase difference and the admittance absolute value by using the resistance component computing means 6a, and then the obtained resistance component is compared with an electric leak reference value by using the comparing means 6b.

Figure 20:
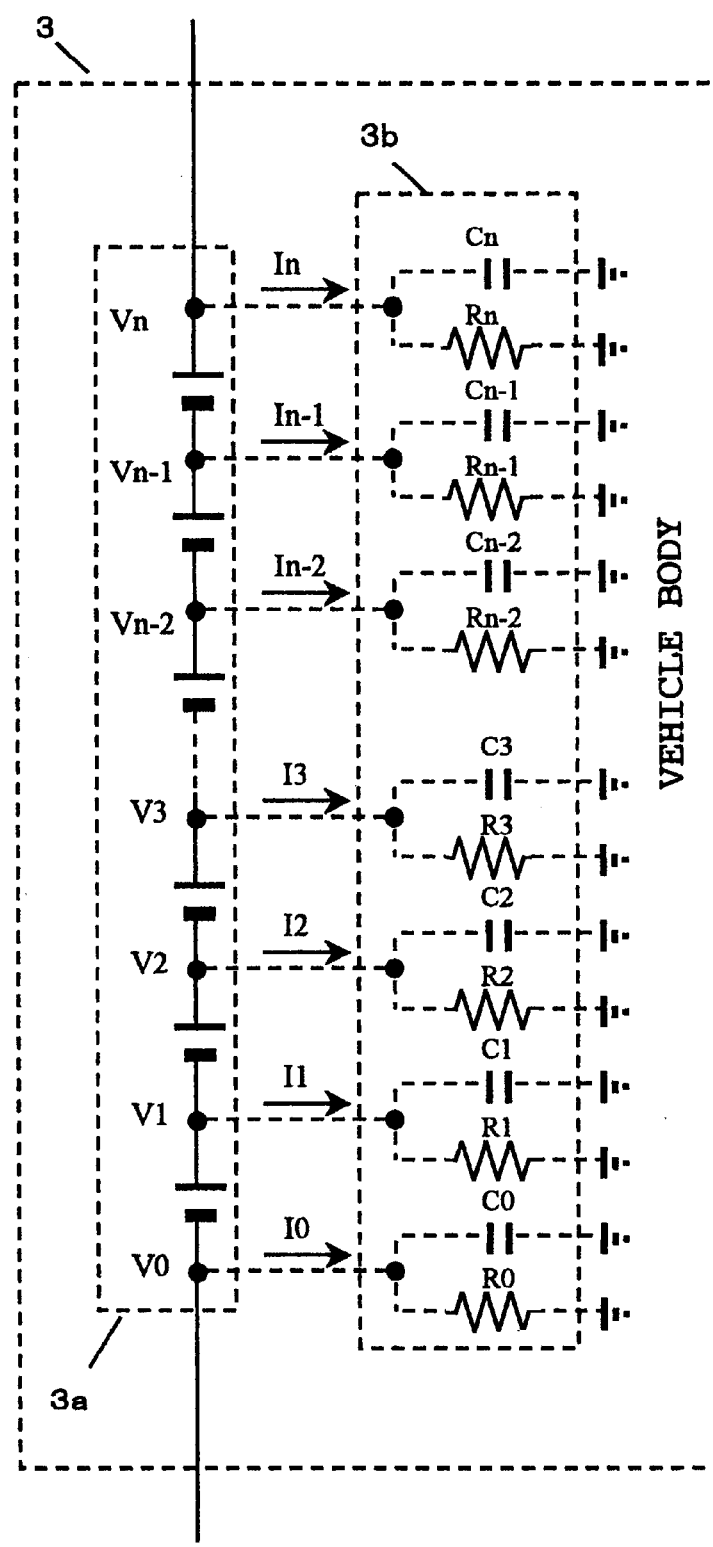
FIG. 20 is an equivalent circuit indicating an electric leak admittance of a battery pack.
Figure 21:
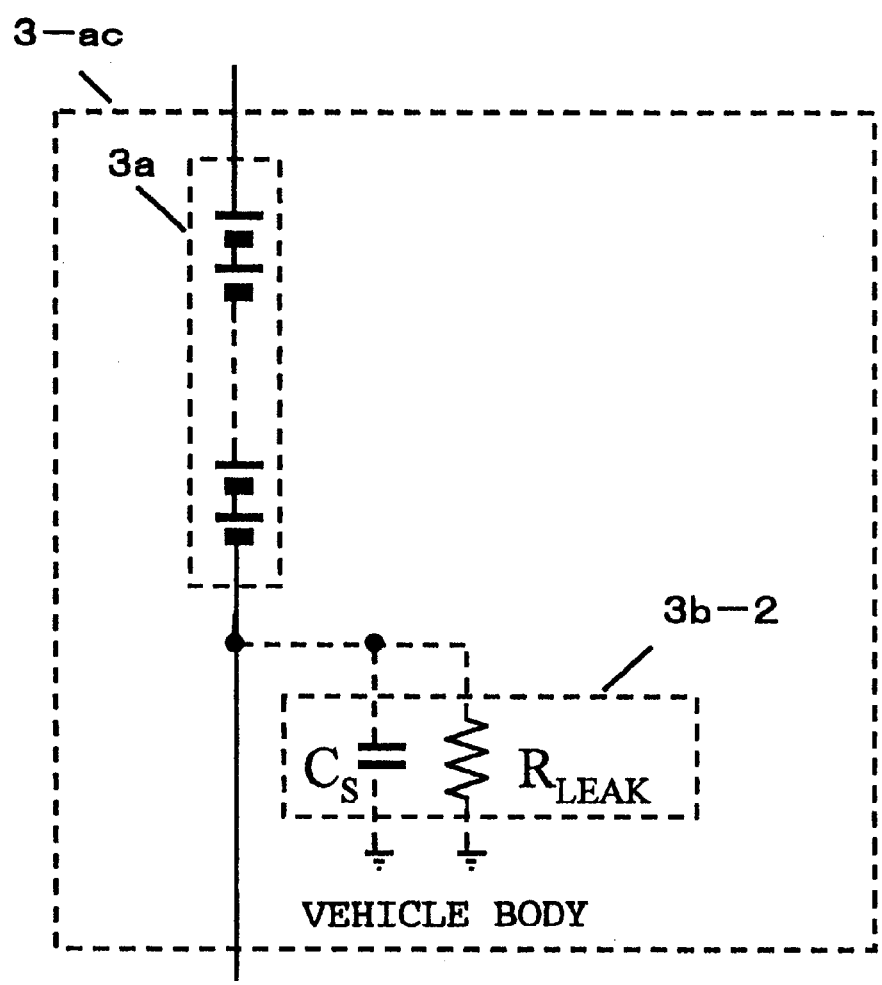
FIG. 21 is an AC equivalent circuit indicating an electric leak admittance of a battery pack.
Figure 22:
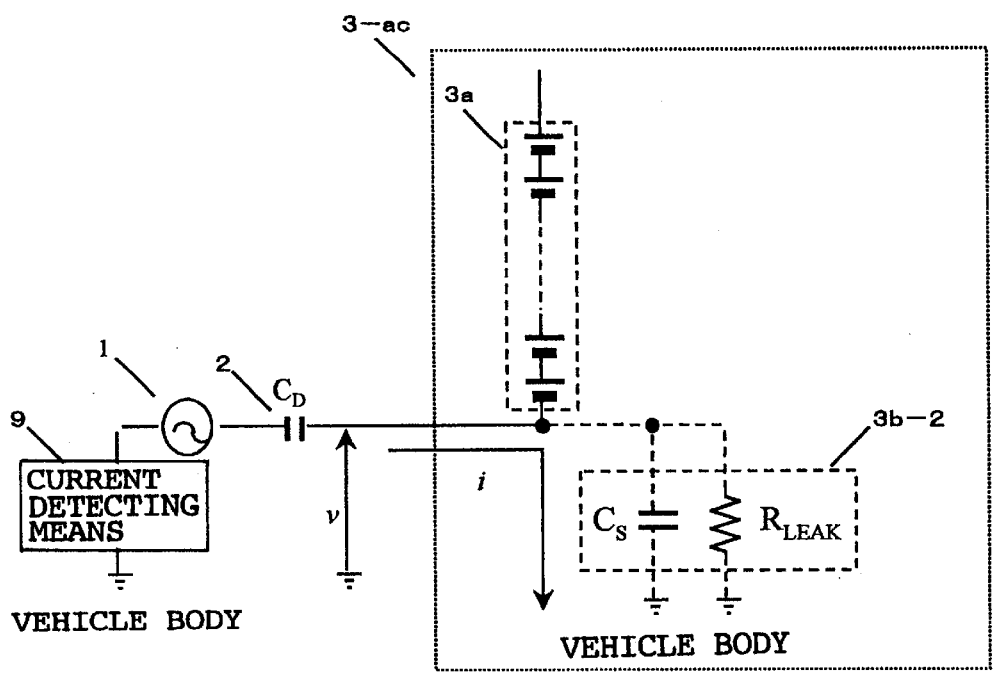
FIG. 22 is a configuration of an electric leak detecting apparatus that adopts a related art AC method.
Figure 22:
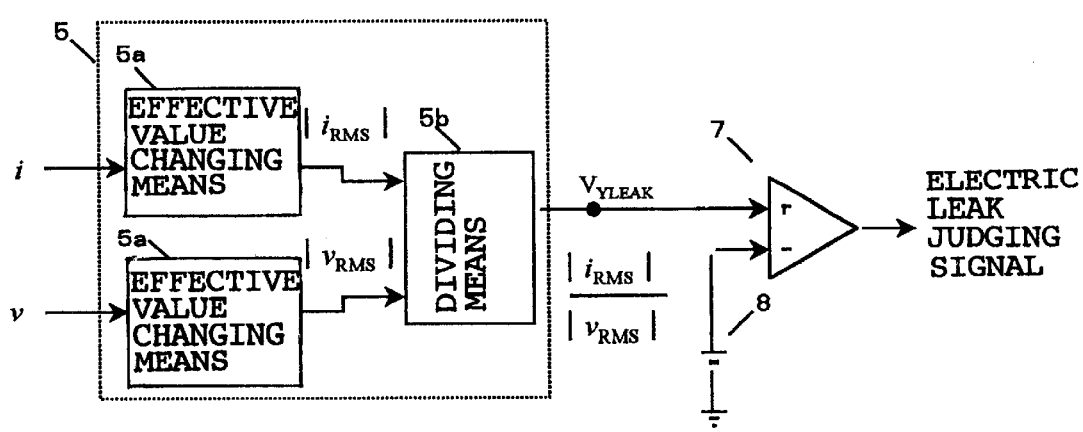
Figure 23:
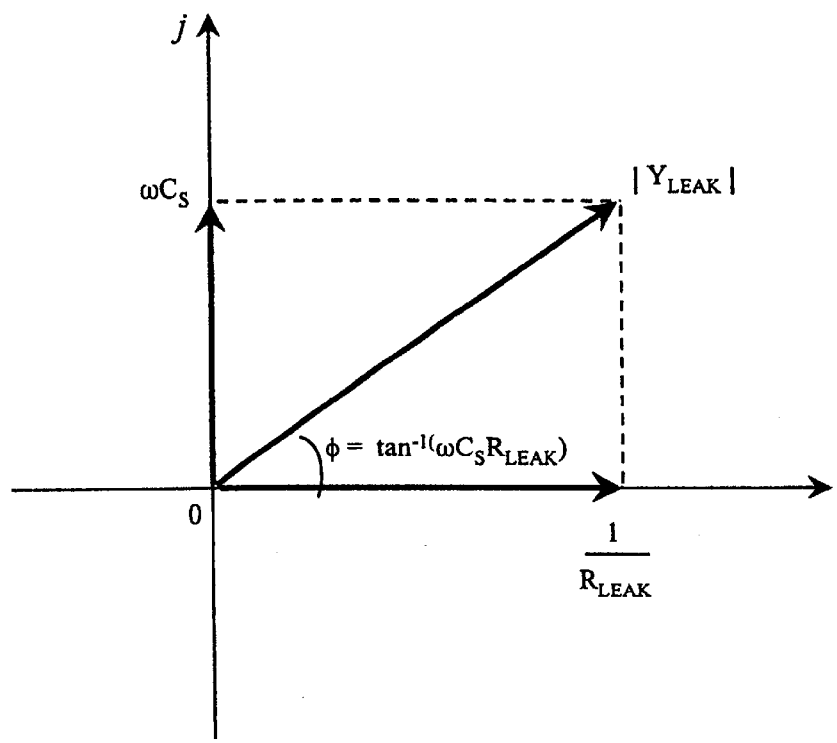
FIG. 23 illustrates a complex element vector of an electric leak admittance.
Figure 24:
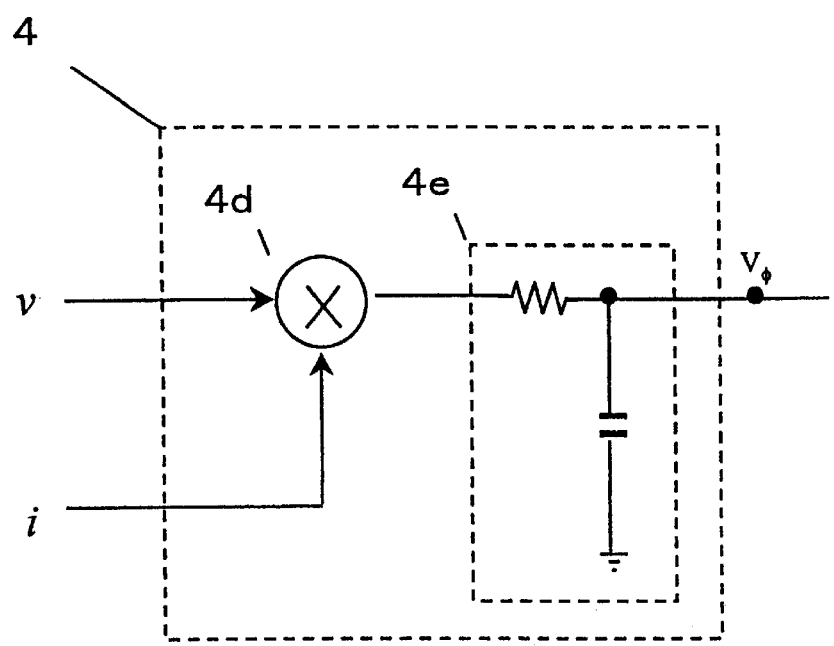
FIG. 24 is a configuration of a phase discriminating means in another embodiment of the present invention.

Next, the operation of the electric leak detecting apparatus of the present invention will be described. The admittance of the whole portion between the AC signal source 1 and the vehicle body is equal to 3b shown in FIG. 20 and it is indicated by a complex vector as shown in FIG. 23. The admittance Y of the whole portion becomes as shown in Equation 4.

[Equation 4].

$$\begin{cases} Y = \dfrac{Y1 \cdot Y2}{Y1+Y2} = \dfrac{-\omega^2 C_D C_S + j\omega C_D \cdot G_{LEAK}}{G_{LEAK} + j\omega(C_D + C_S)} \\ \phantom{Y} = \dfrac{\omega^2 C_D^2 G_{LEAK} + j\omega\{C_D G_{LEAK}^2 + \omega^2 C_D C_S(C_D + C_S)\}}{G_{LEAK}^2 + \omega^2(C_D + C_S)^2} \\ \Theta G_{LEAK} = \dfrac{1}{R_{LEAK}} = \dfrac{1}{R_0} + \Lambda + \dfrac{1}{R_n} \\ \Theta C_S = C_0 + \Lambda + C_n \end{cases}$$

Figure 15:
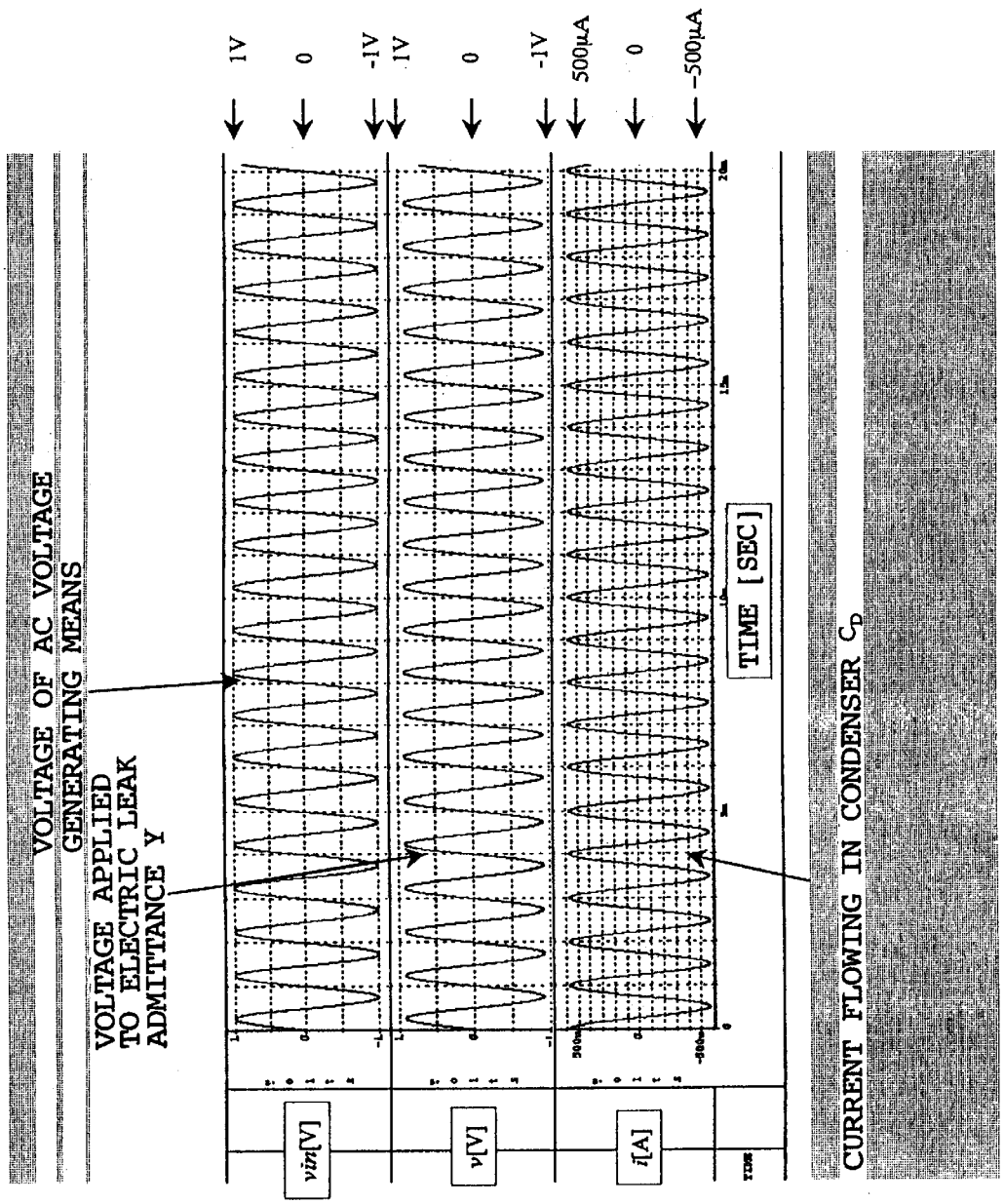
FIG. 15 is a voltage/current of a detecting signal in each part of the electric leak detecting apparatus of the present invention.

At this time, if (Equation 5) is satisfied, the voltage v is obtained by dividing the voltage vin by the condenser 2 and the electric leak admittance 3b-2, that is, |YLEAK| as shown in FIG. 15.

[Equation 5]

$$C_S \ll C_D$$

Figure 3:
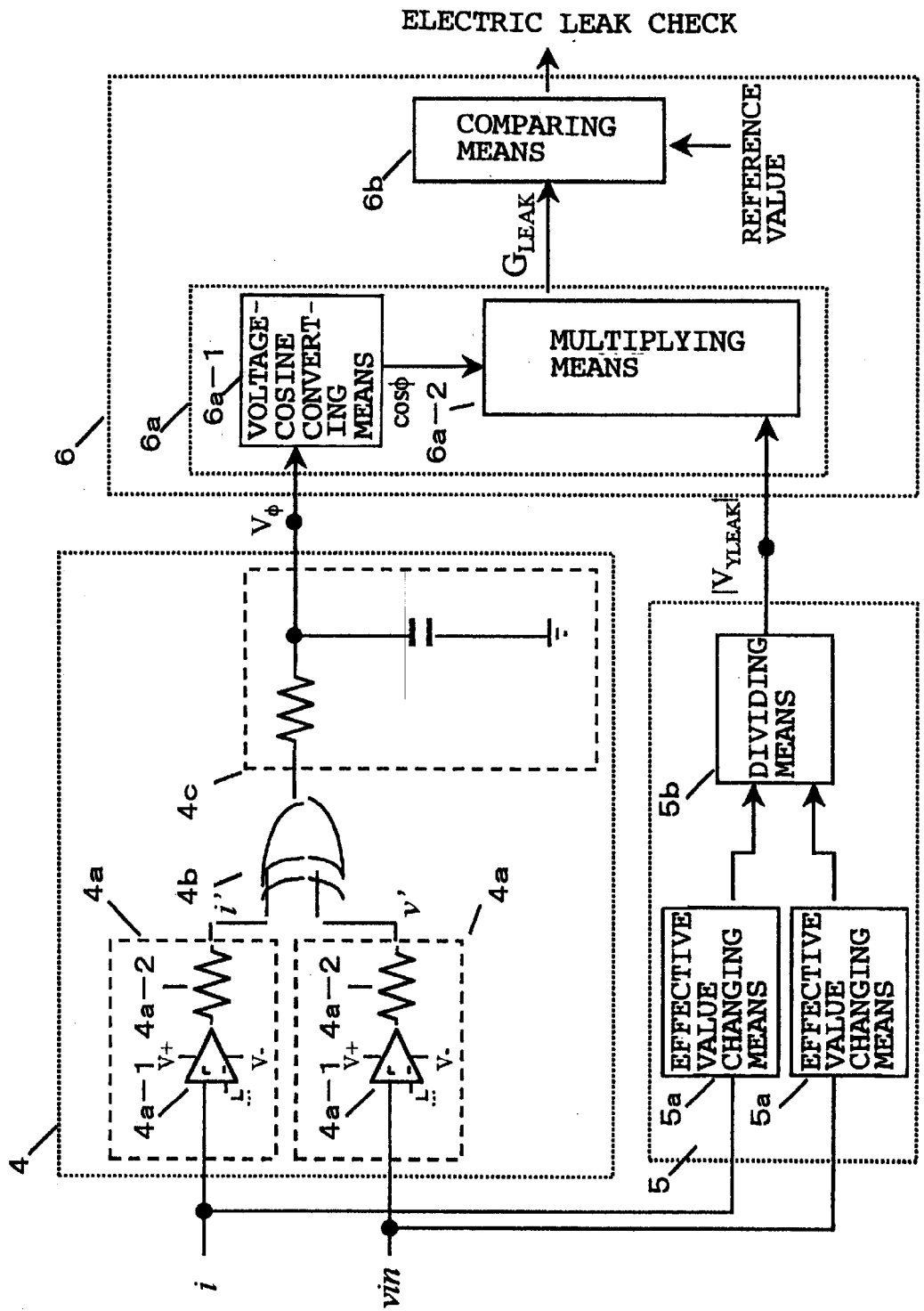
FIG. 3 is a configuration of the electric leak detecting apparatus of the present invention in another embodiment, which uses the AC method.

The phase and the amplitude can thus be regarded to be almost equal between the voltage v and the voltage vin. Consequently, the voltage v may be measured via the insulation amplifying means 16. It is also possible to substitute the voltage v for the voltage vin as shown in FIG. 3. This means that it is only needed to measure the voltage at the side of the AC signal source 1 and it is not needed to measure the voltage at such side of the condenser 2 on the set battery side which is of a high voltage and is dangerous. In addition, the amplitude reduced by the above voltage dividing may also be obtained by using v in Equation 6.

[Equation 6]

$$v'_{in} = \frac{C_S + C_D}{C_S} \cdot v_{in}$$

FIGS. 2 to 13 show a configuration of the electric leak detecting apparatus of the present invention when both voltages v and vin are use. The object admittance YLEAK will be as shown in Equation 7.

[Equation 7].

$$Y \cong Y_{LEAK} = \left(\frac{1}{R_0} + \Lambda + \frac{1}{R_n}\right) + j\{\omega(C_0 + C_n)\}$$

Figure 2A:
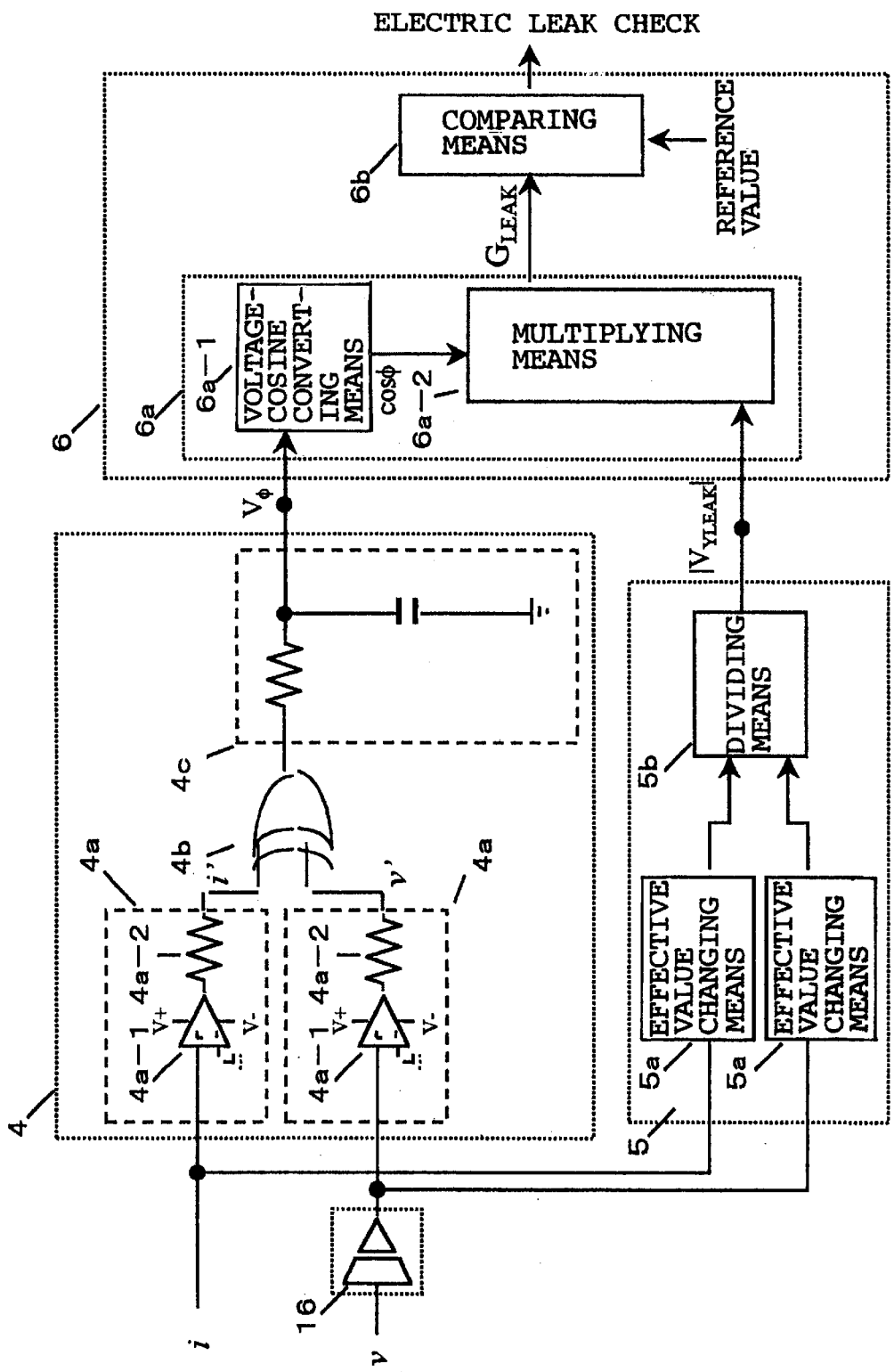
FIG. 2 is a configuration of an electric leak detecting apparatus of the present invention in an embodiment.
Figure 2B:
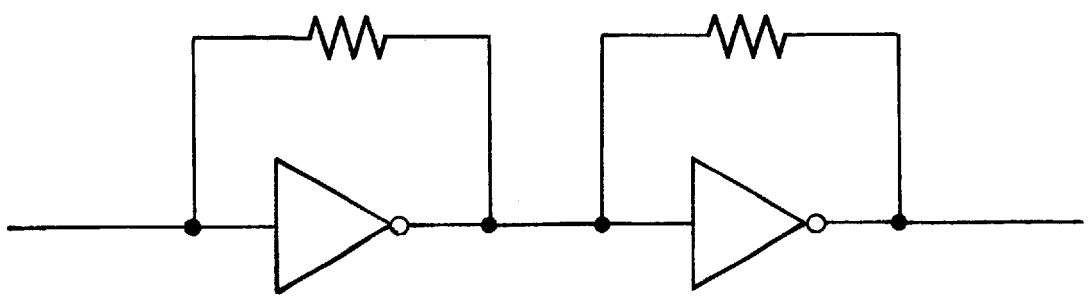

The current i leaks to the vehicle body via the AC signal source 1 and the condenser 2. The phase discriminating means 4 is used to convert the phase difference between the AC current i of the AC signal source 1 and the AC voltage v to a voltage Vφ. The phase discriminating means 4, as shown in FIG. 2(a), can be composed of a voltage comparing circuit 4a, an exclusive-or circuit 4b, and an integration circuit 4c. The voltage comparing circuit 4a is copposed of a comparator 4a-1 used to compare a potential with another, as well as a resistor 4a-2. The comparator 4a-1 is used as a saturation-amplifier to detect the phase difference between the current i and the voltage v more effectively. Of course, the comparator 4a-1 may be composed of a high amplification factor amplifier as shown in FIG. 2 (b).

4b is an exclusive-or circuit and 4c is an integration circuit composed of a resistor and a condenser and used to average the output voltage from the exclusive-or circuit 4b so as to find the voltage Vø which is equivalent to the phase difference between the AC current i and the AC voltage v. The resistor 4a-2 is not a core part of the phase discrimination procedure, so it may be omitted. Although the integration circuit 4c is used to convert a result of phase comparison to a voltage Vø in this embodiment, it may be replaced with a digital circuit that can detect and output a duty ratio accurately. When the phase difference between the current i and the voltage v is detected within 0 to $\pi/2$ and the high side output voltage from the integration circuit 4c is E[V], and the duty ratio of the exclusive-or output is D[%], then the mean voltage Vø is as follows:

VOLTAGE AVERAGED BY INTEGRATION CIRCUIT $\quad V_\phi = \frac{E}{2} \cdot D \quad$ [Equation 8]

DUTY RATIO $\quad D = \frac{2}{\pi}\phi \cdot 50 \, [\%] \quad$ [Equation 9]

Figure 16:
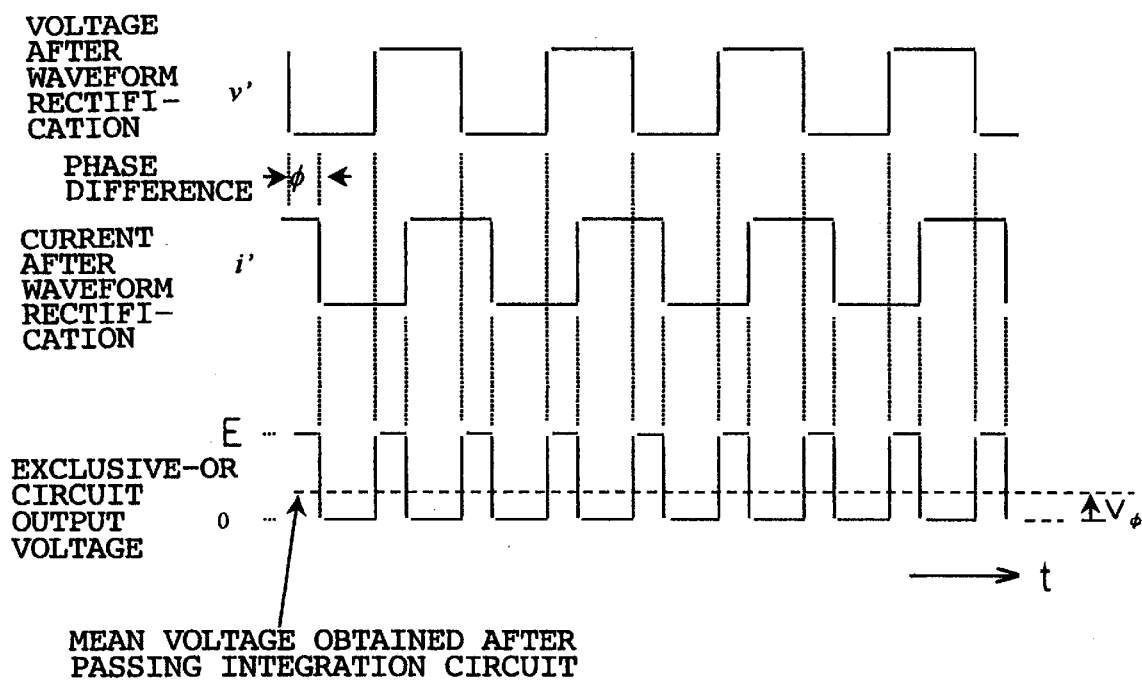
FIG. 16 illustrates the input/output waveform of a phase discriminating circuit and the mean voltage of the circuit after passing through an integration circuit.
Figure 16:
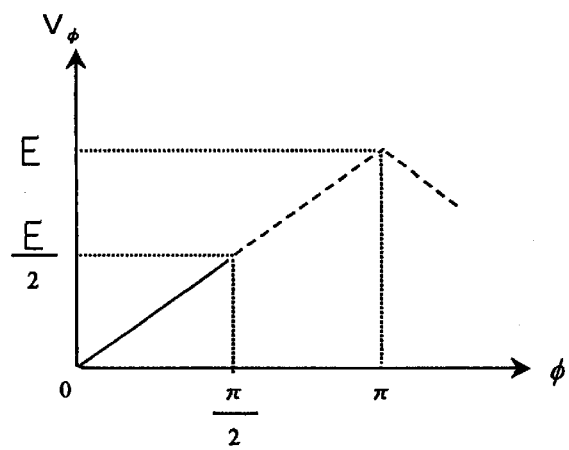

If the output voltage from the exclusive-or circuit is 0 when low and E when high, which are ideal values, then the phase difference voltage Vφ is changed linearly to the phase difference φ as shown in FIG. 16.

Figure 17:
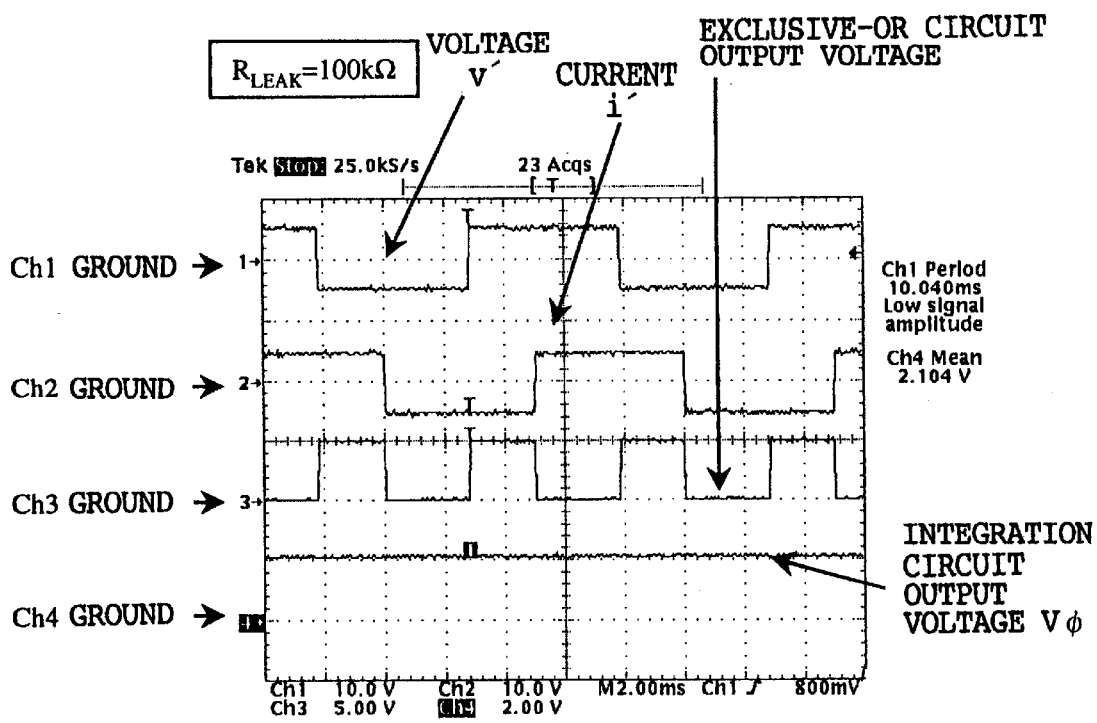
FIG. 17 is the input/output waveform of the phase discriminating circuit of the electric leak detecting apparatus of the present invention and a waveform indicating the mean voltage of the phase discriminating circuit after passing through the integration circuit.
Figure 17:
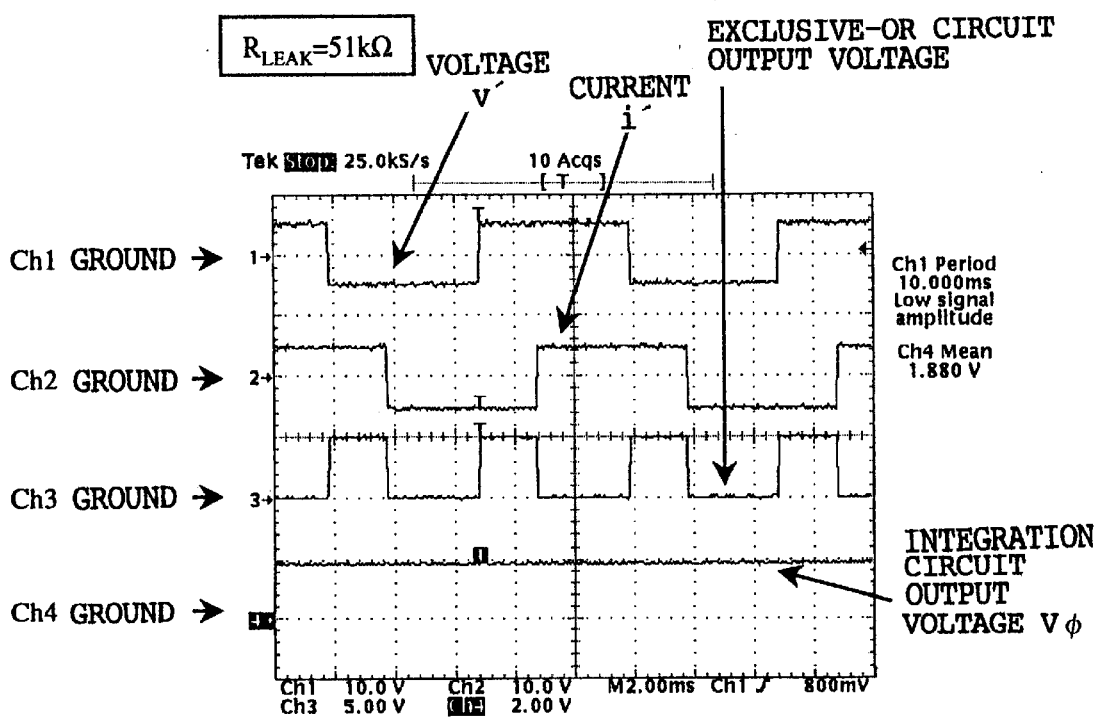
Figure 18:
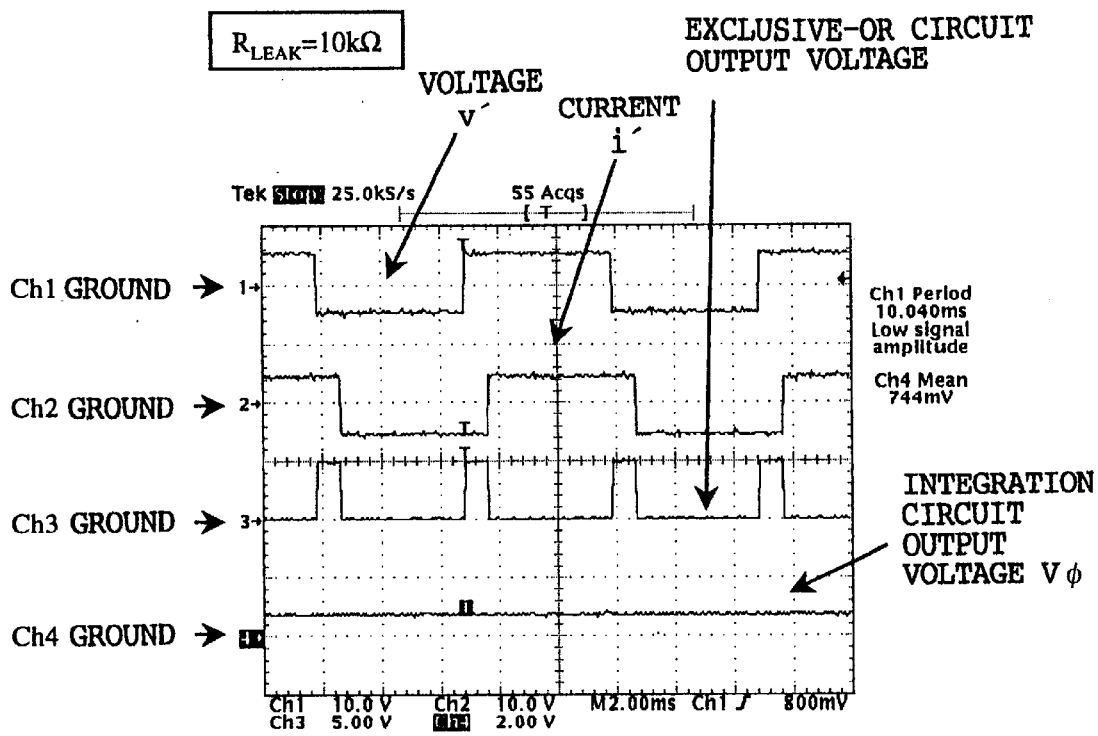
FIG. 18 is the input/output waveform of the phase discriminating circuit of the electric leak detecting apparatus of the present invention and a waveform indicating the mean voltage of the phase discriminating circuit after passing through the integration circuit.
Figure 18:
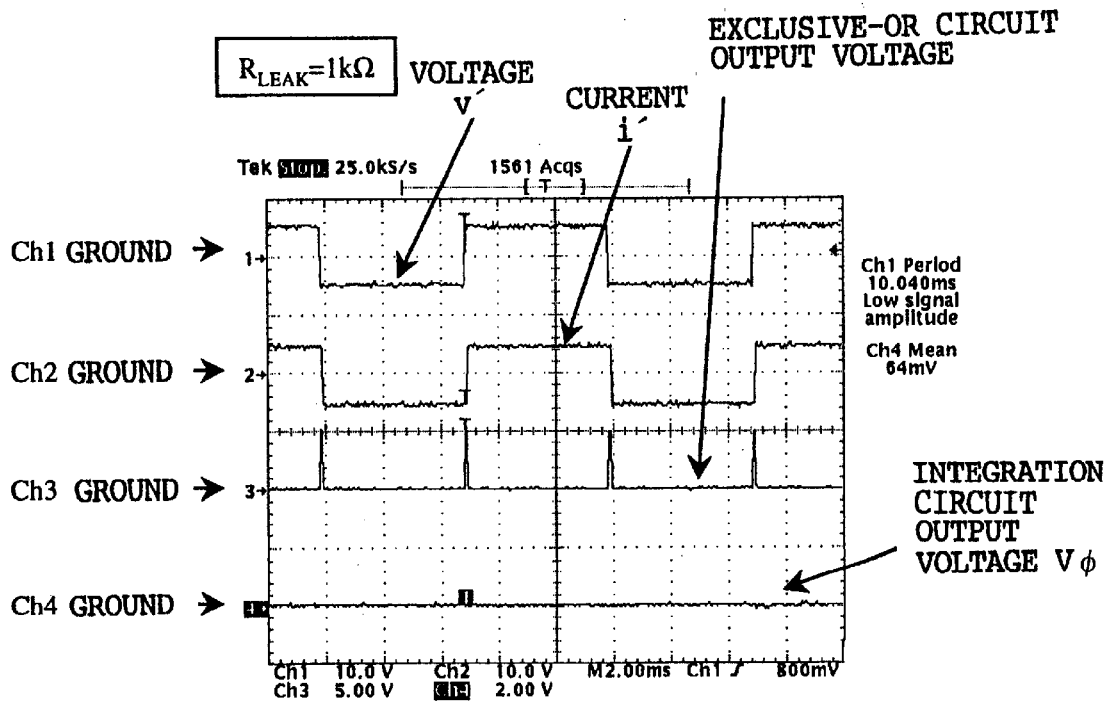
Figure 19:
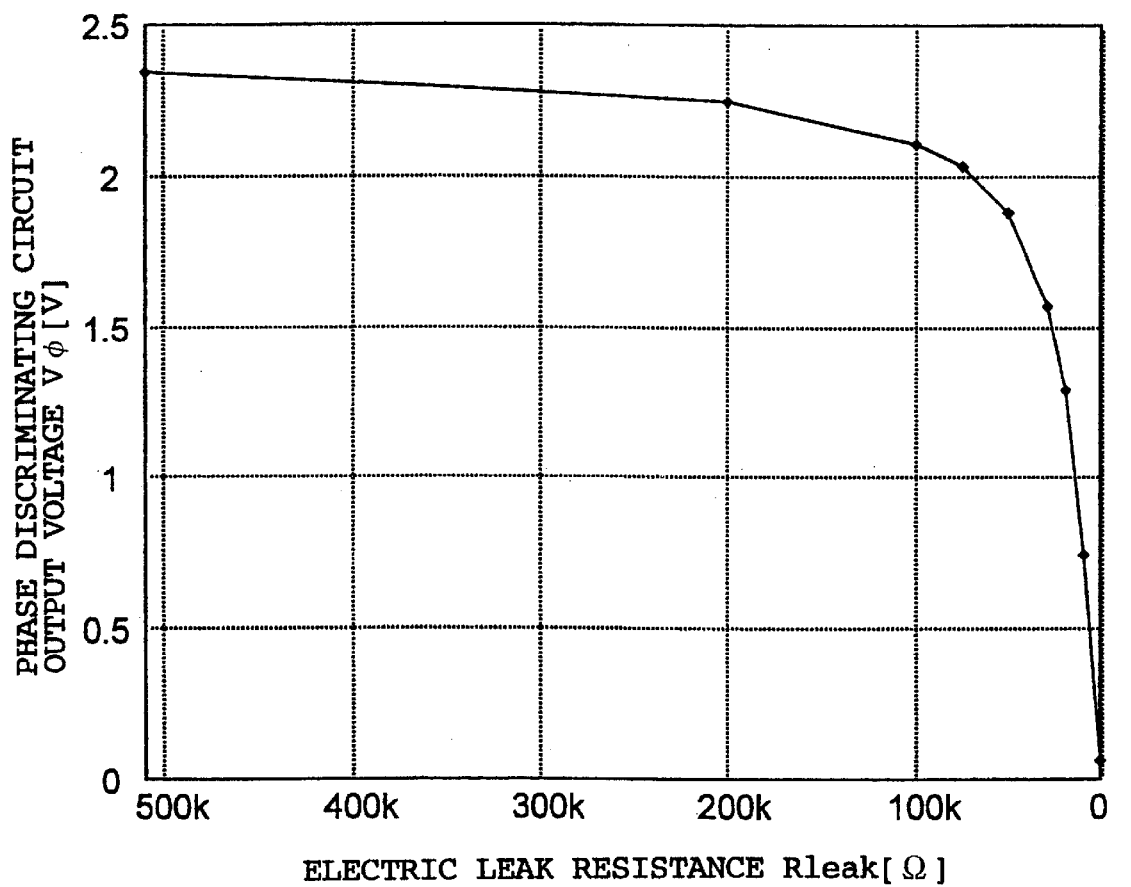
FIG. 19 is a graph indicating an electric leak RLEAK of the electric leak detecting apparatus of the present invention and the mean output voltage Vφ of the phase discriminating circuit.

Next, the waveform of each part of the electric leak detecting apparatus during operation will be shown when a single sine wave signal of 1 kHz in frequency and 1V in amplitude is input during conditions of input capacitance Cd=10 uF and floating capacitance Cs=0.1 uF. FIGS. 17 and 18 show the waveforms of the rectified AC current i', the AC voltage v', and the output voltage Vf from the phase discriminating means 4 during operation when RLEAK is 100 kΩ, 51 kΩ, 10 kΩ, or 1 kΩ. FIG. 19 shows output voltage characteristics of the phase discriminating means 4 when the electric leak resistance RLEAK is changed under the above conditions. In FIGS. 17 and 18, the horizontal axis is time and the vertical axis is a voltage or a current.

In the admittance detecting means 5, the current i flowing in the electric leak admittance 3b-2 is detected by the current detecting means 9 and the current i and the AC voltage v are converted to effective value by calculating a root-mean-square respectively by the effective value converting means 5a and furthermore, the effective current value |iRMS| is divided by the effective voltage value |vRMS| by a dividing means 5b, thereby to find an admittance |Y|.

The means for obtaining the current i may be inserted in any position in the system composed of the AC voltage generating means 1, the condenser (Cd), and the electric leak admittance 3b-2 and then the position is not restricted to the configuration of the FIG. 1. If the current i is to be measured indirectly using a transformer, etc., the current obtaining means may be inserted on the set battery 3a side when viewing it from the condenser (Cd).

Figure 4:
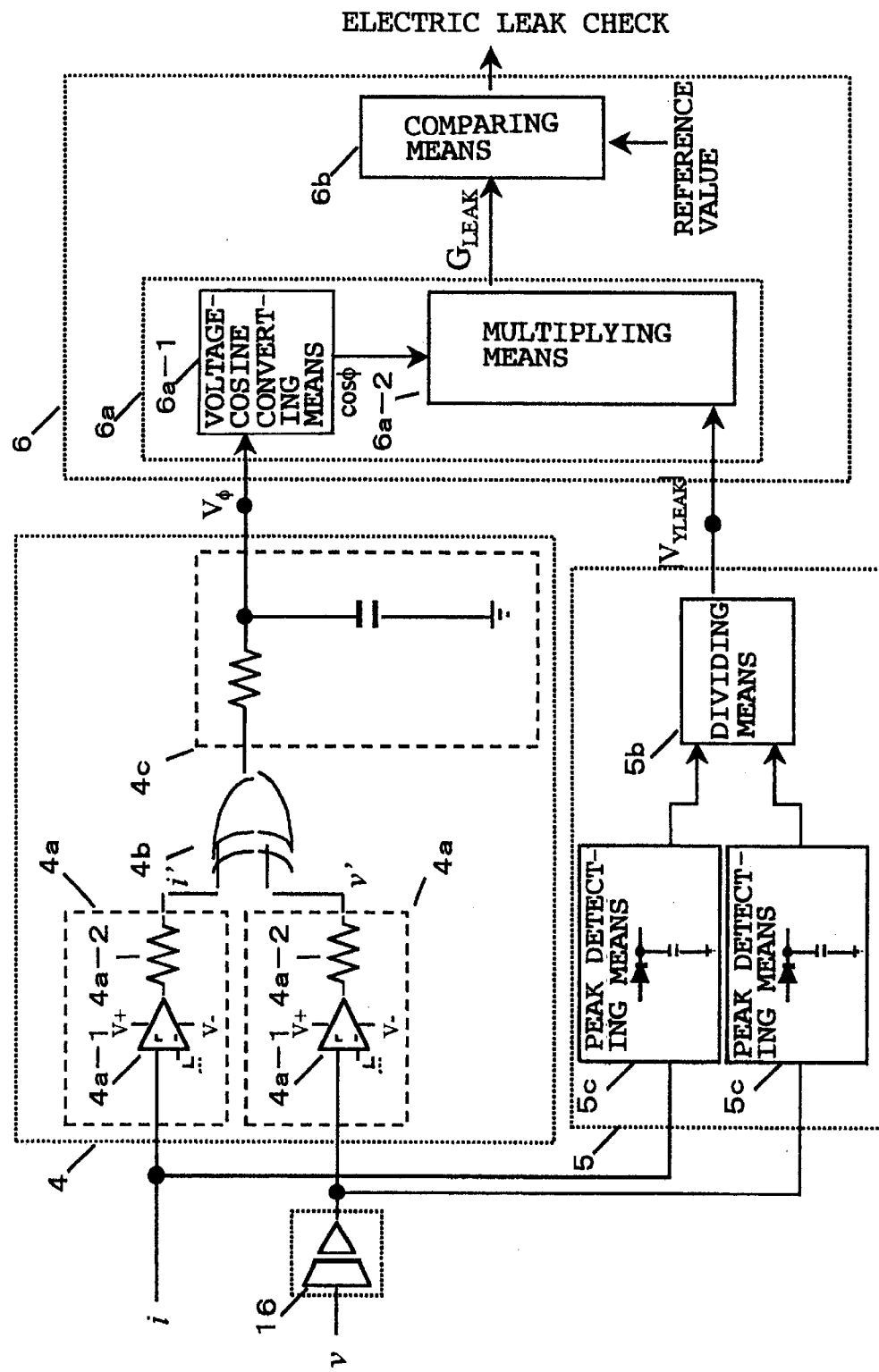
FIG. 4 is a configuration of the electric leak detecting apparatus of the present invention in another embodiment, which uses the AC method.
Figure 5:
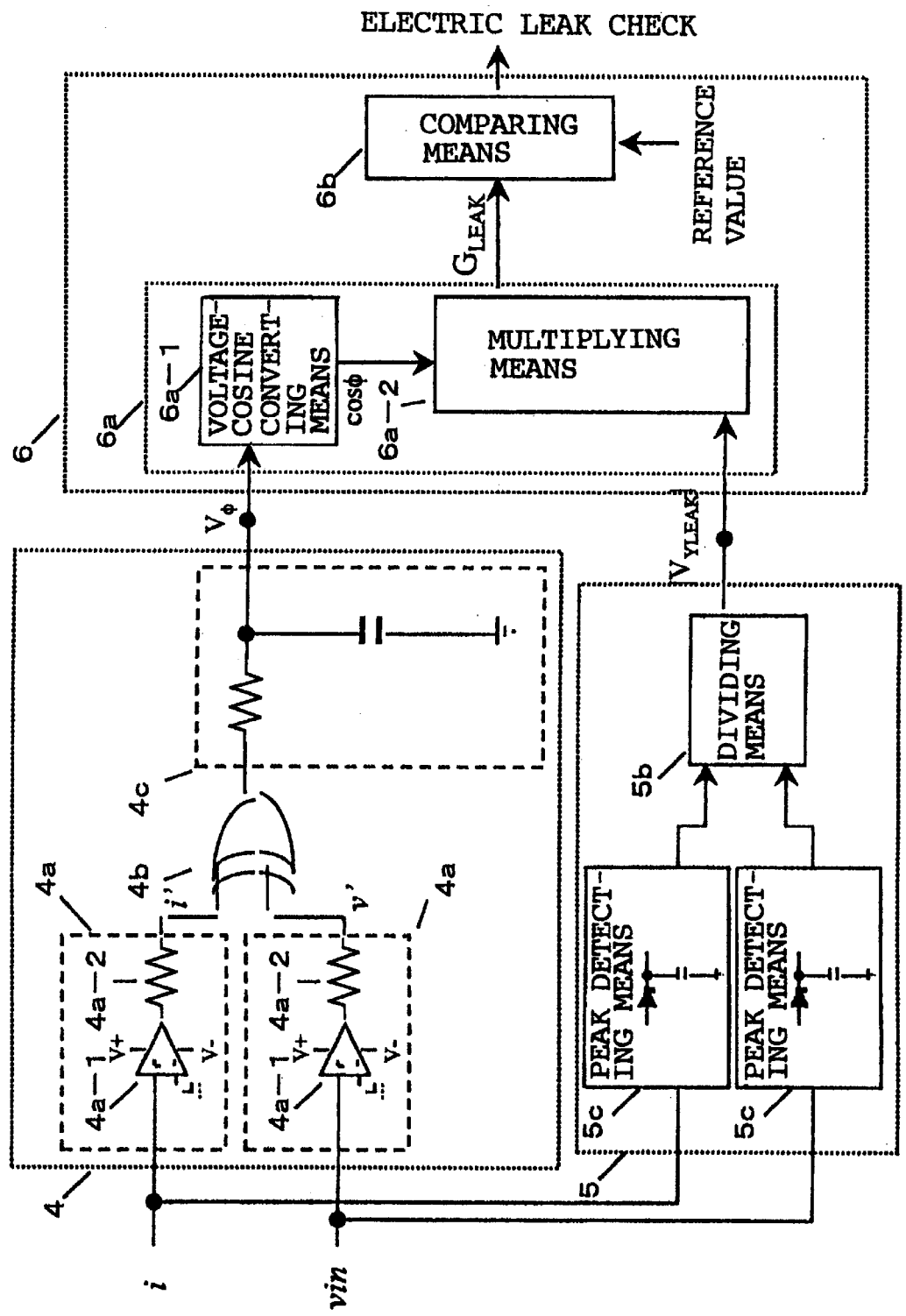
FIG. 5 is a configuration of the electric leak detecting apparatus of the present invention in another embodiment, which uses the AC method.

As shown in FIGS. 4 and 5, the admittance |Y| can be found more easily than by using the effective value by such manner that a peak value of the voltage of the AC signal source 1 and a peak value of the current i flowing in the condenser 2 is detected by peak detecting means 5c instead of using the effective value converting means 5a and the peak value of the current i divided by the peak value of the voltage of the AC signal source 1 by dividing means 5b.

Figure 6:
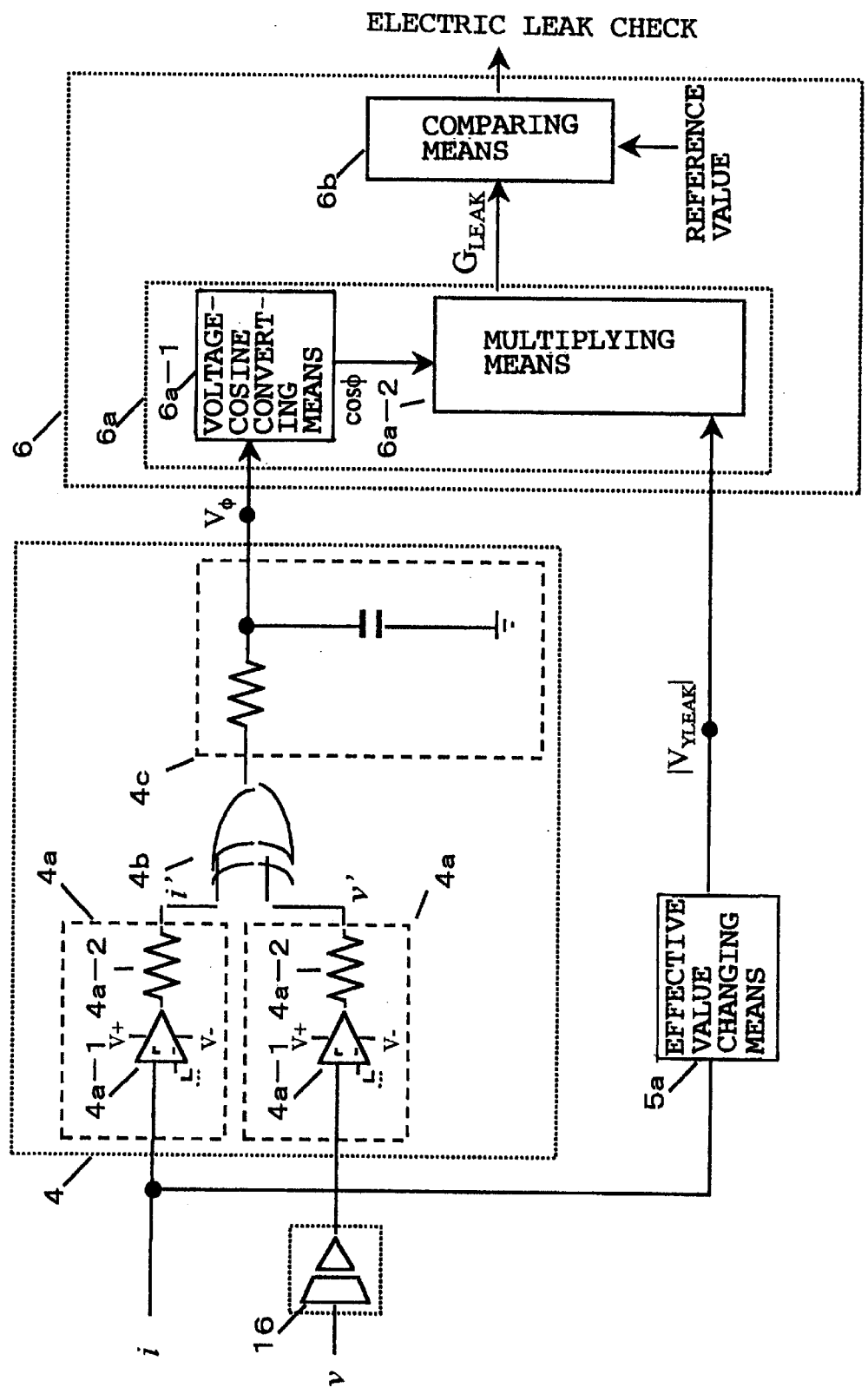
FIG. 6 is a configuration of the electric leak detecting apparatus of the present invention in another embodiment, which uses the AC method.
Figure 7:
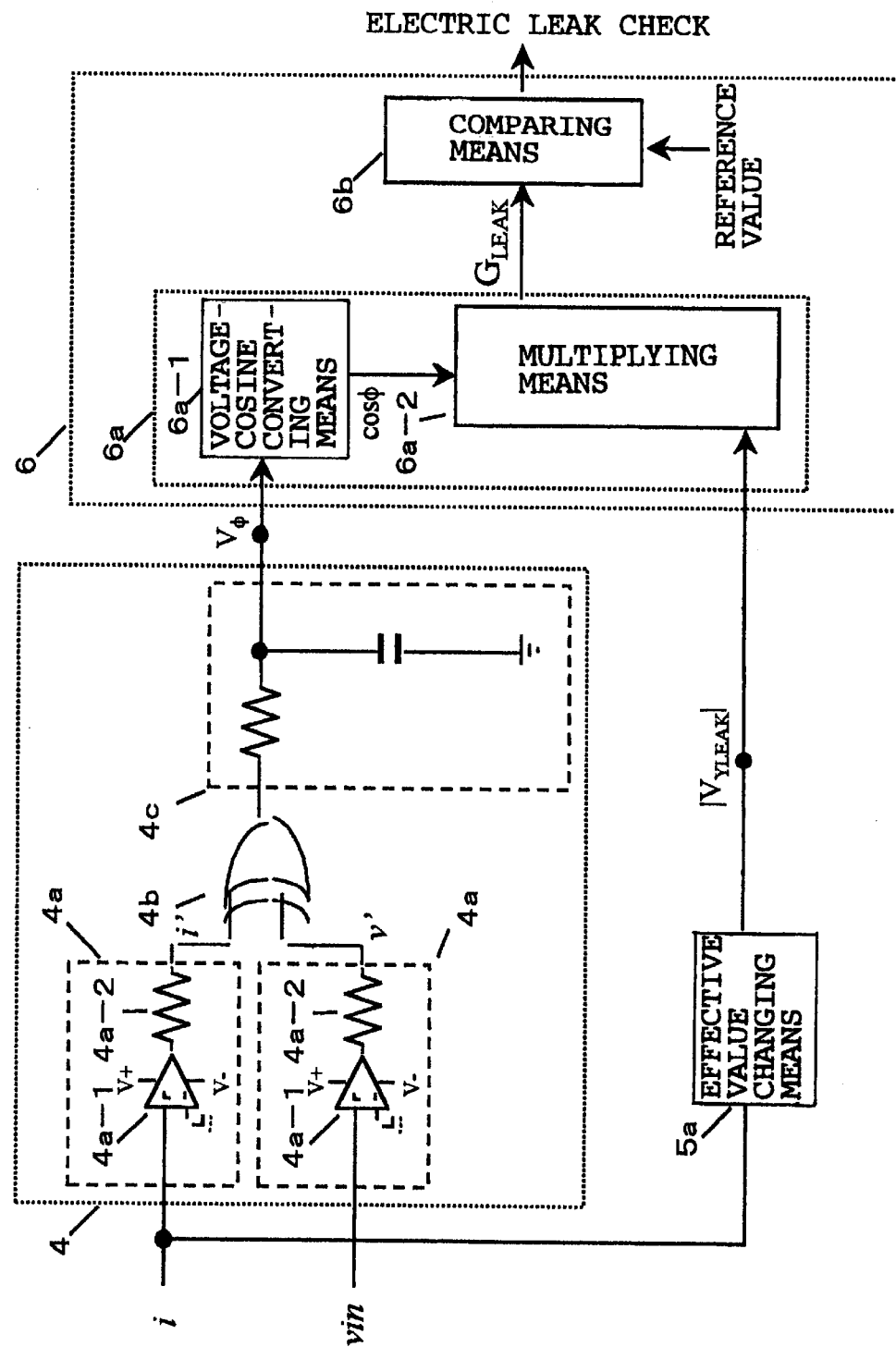
FIG. 7 is a configuration of the electric leak detecting apparatus of the present invention in another embodiment, which uses the AC method.

As shown in FIGS. 6 and 7, when the AC signal source 1 whose effective voltage is a known unit voltage is used, the dividing process may be omitted from the admittance detecting process in FIGS. 2, 3. The structure of the apparatus can thus be simplified significantly.

Figure 8:
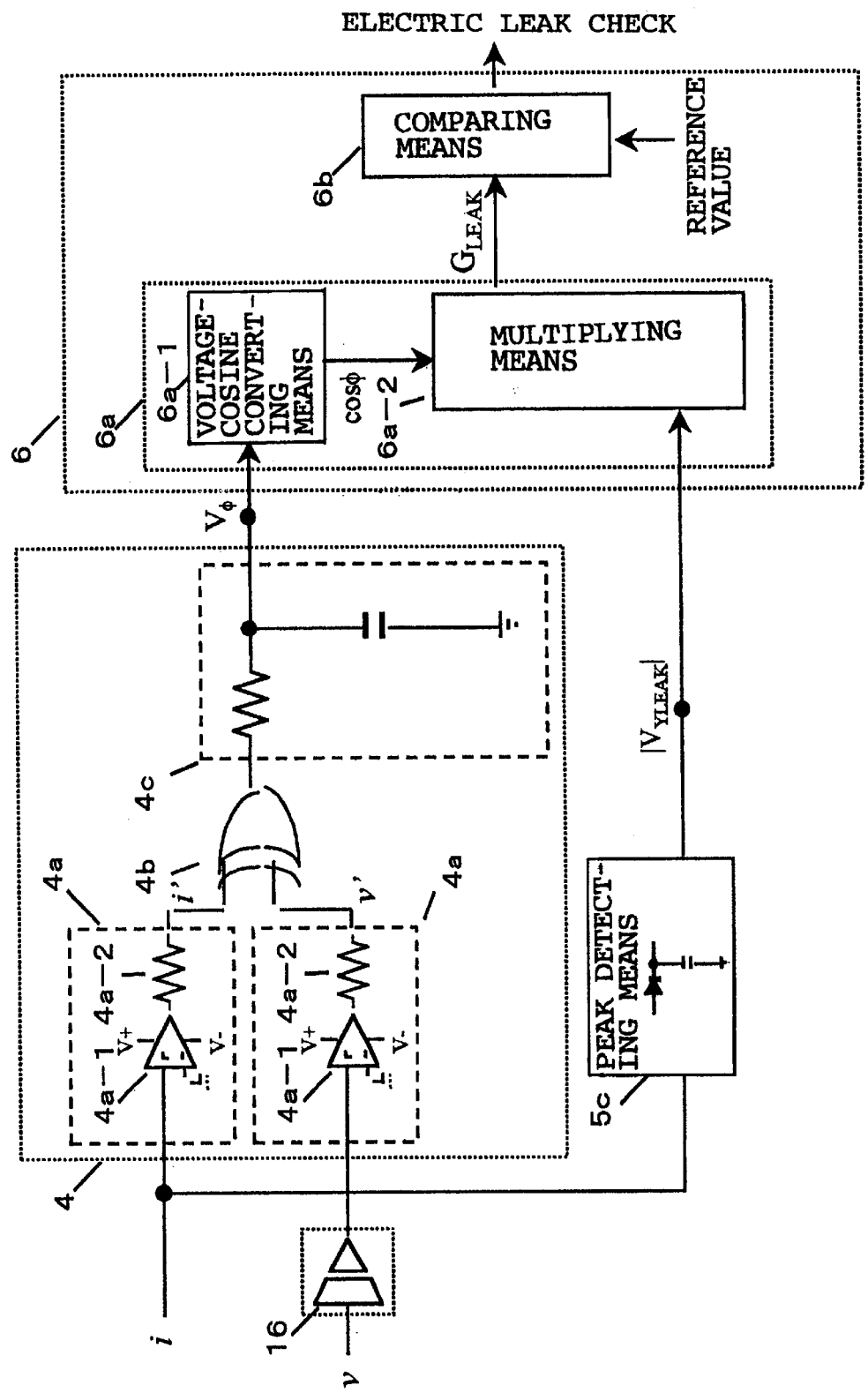
FIG. 8 is a configuration of the electric leak detecting apparatus of the present invention in another embodiment, which uses the AC method.
Figure 9:
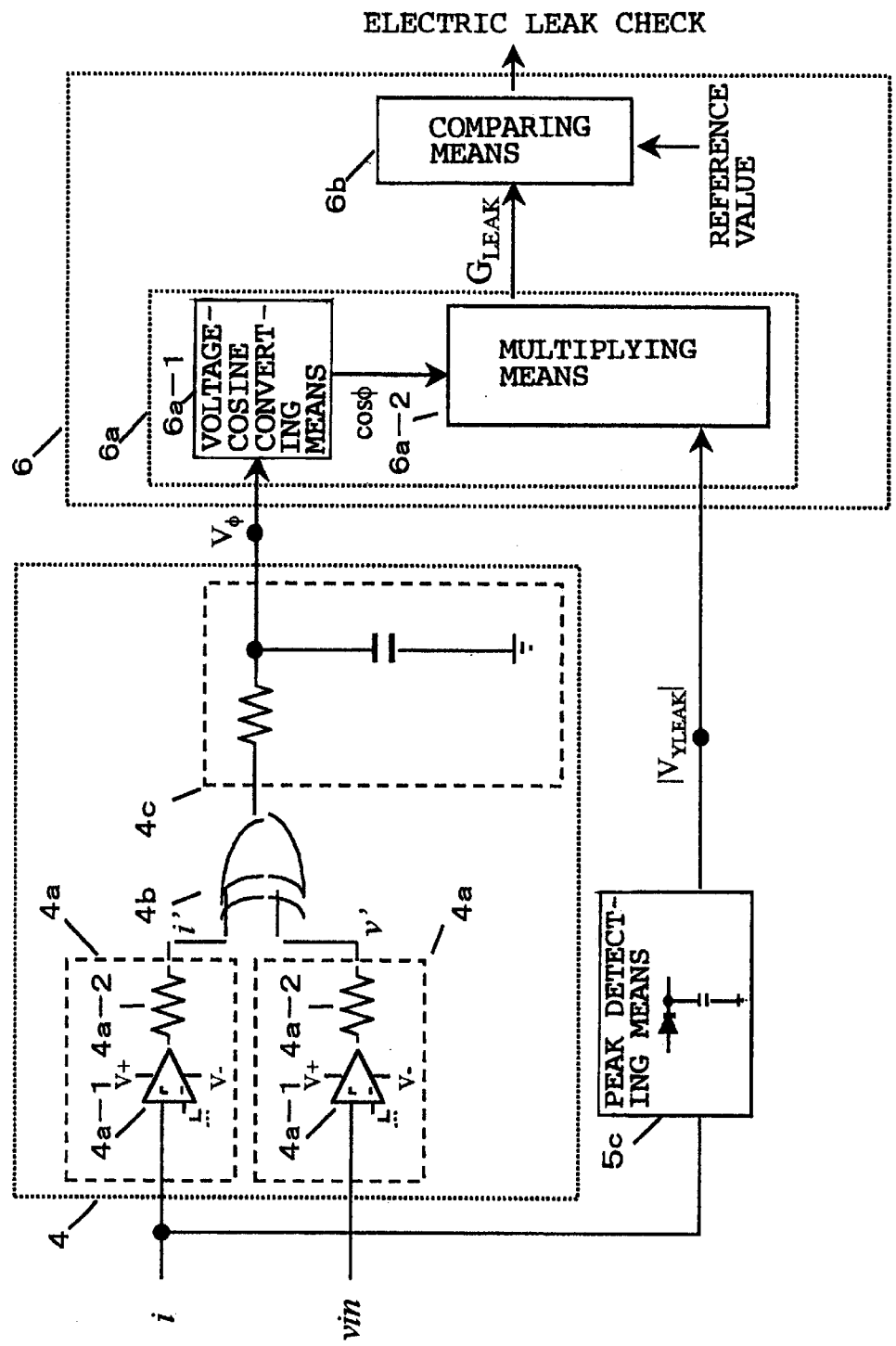
FIG. 9 a configuration of the electric leak detecting apparatus of the present invention in another embodiment, which uses the AC method.

Furthermore, as shown in FIGS. 8 and 9, when the AC signal source 1 whose peak value is a known unit voltage is used, the dividing process may be omitted from the admittance detecting process in FIGS. 4, 5 just like in the above case. The structure of the apparatus can thus be simplified significantly.

In the electric leak judging means 6 the voltage cosine converting means 6a-1 obtains a cosine of the phase difference φ from the voltage Vφ corresponding to the phase difference φ by using a reference table which stores the correspondence between the voltage Vφ and the cosine beforehand, and the multiplying means 6a-2 multiplies the cosine by the admittance |YLEAK| thereby to find a resistance component which is an electric leak resistance RLEAK from the admittance absolute value. The electric leak resistance RLEAK is compared with the electric leak resistance reference value in the comparing means 6b thereby to judge existence of an electric leak. The electric leak judging means 6 can be composed of an analog-digital converting circuit and a microcomputer. The voltage-cosine converting circuit 6a-1 may be composed of a reference table composed of memories as described above, as well as a microcomputer used for computing. FIG. 19 shows the output voltage characteristics of the phase discriminating means 4 when the electric leak resistance is changed within 500 kΩ to 1 kΩ.

Figure 10:
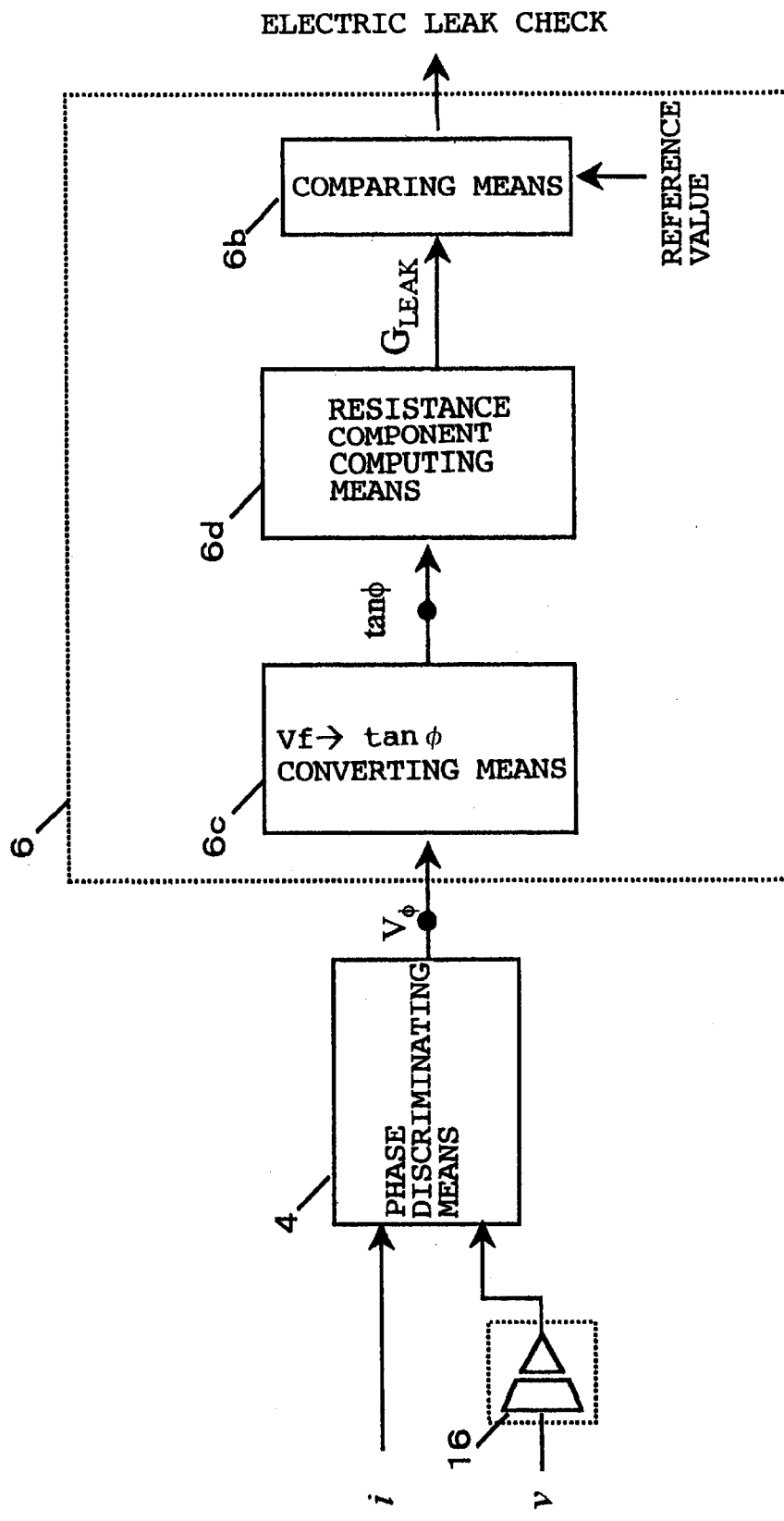
FIG. 10 is a configuration of the electric leak detecting apparatus of the present invention in another embodiment, which uses the AC method.
Figure 11:
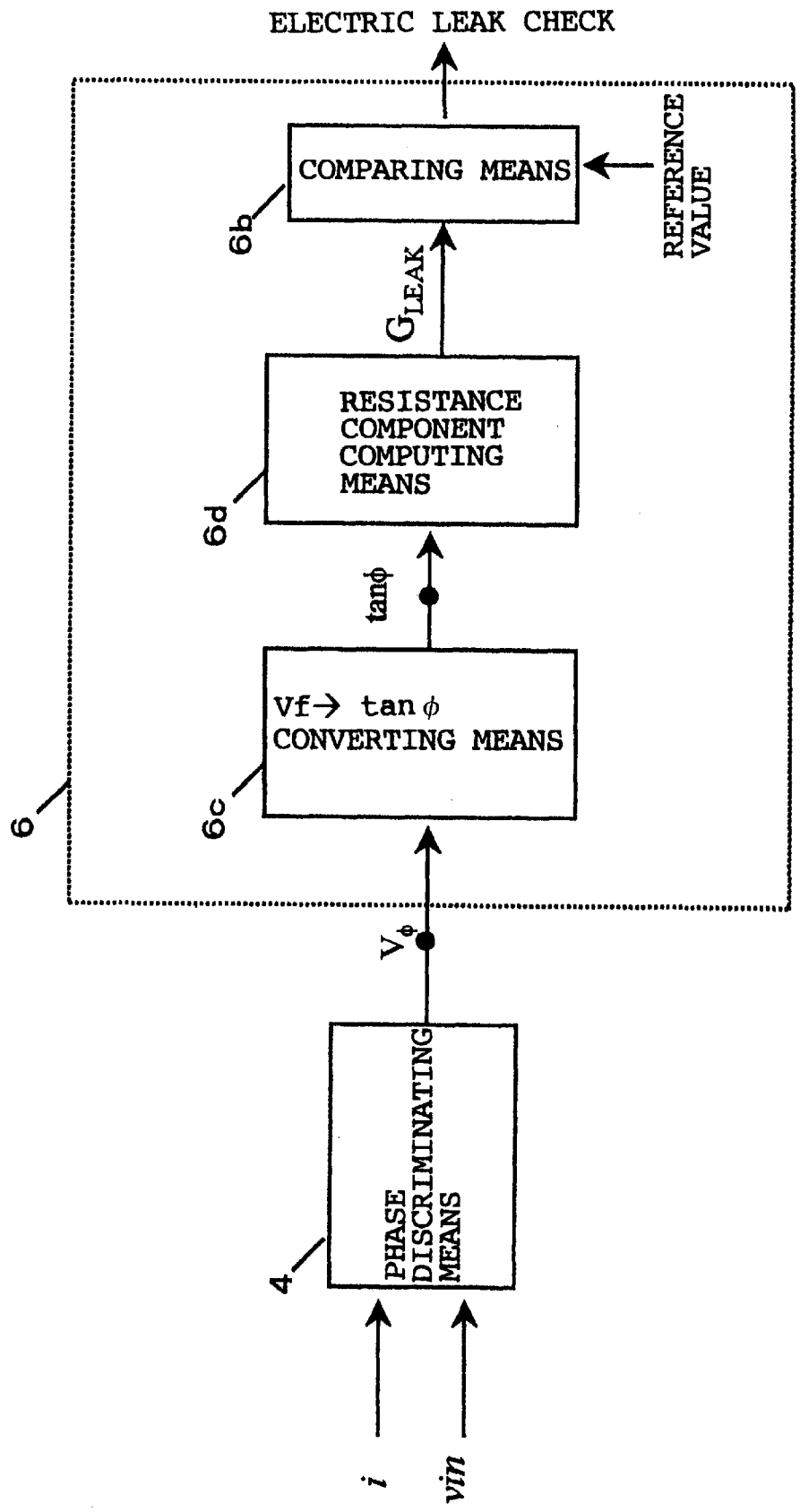
FIG. 11 is a configuration of the electric leak detecting apparatus of the present invention in another embodiment, which uses the AC method.

FIGS. 10 and 11 show an electric leak detecting apparatus that uses another AC method in another embodiment of the present invention. At first, the components of the apparatus will be described. 4 is a phase discriminating means used to extract a phase difference from between the current i and the voltage v as described above. 6c is a converting means used to find a tangent tan φ of the phase voltage Vf. 6d is resistance component computing means used to compute the resistance component |YREAL| using the tangent tan φ in accordance with the following:

$$|Y_{REAL}| = \frac{C_D \tan\phi + \sqrt{(C_D \tan\phi)^2 - 4\omega^2 C_S(C_S + C_D)}}{2}$$

6b is a comparing means used to compare an electric leak value with a predetermined reference value to judge an electric leak as described above. Consequently, the admittance detecting means 5 may be omitted. FIG. 11 shows a case in which vin is used.

Figure 12:
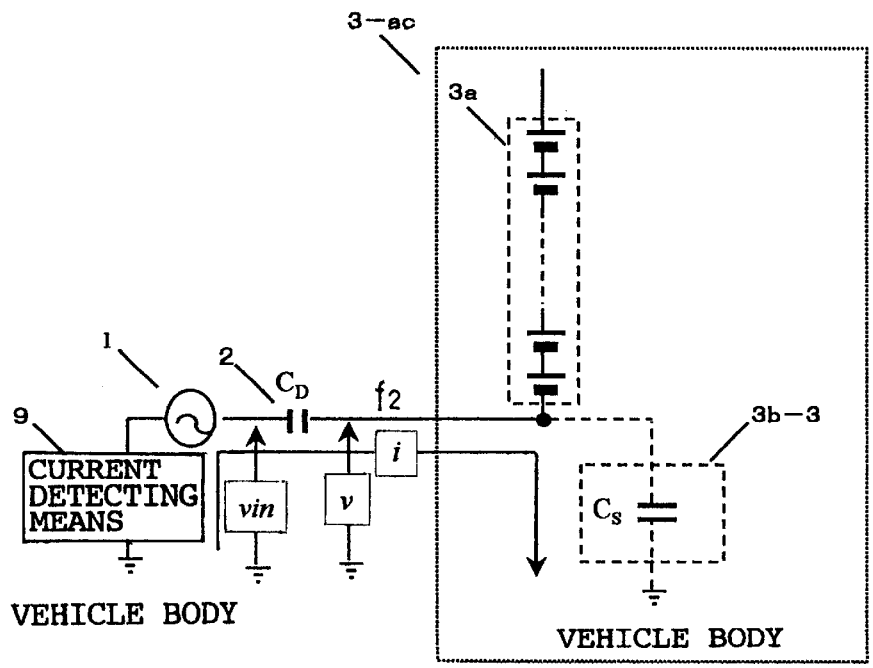
FIG. 12 is a configuration of the electric leak detecting apparatus of the present invention in another embodiment, which uses the AC method.
Figure 12:
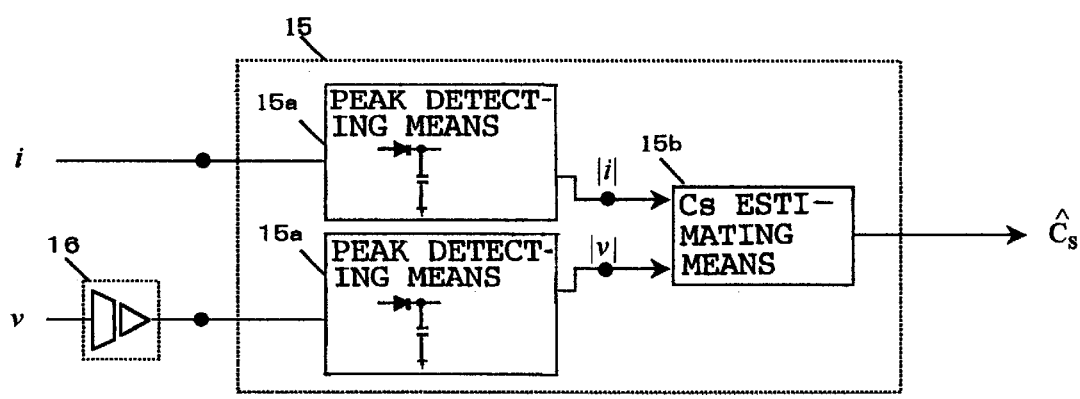
Figure 13:
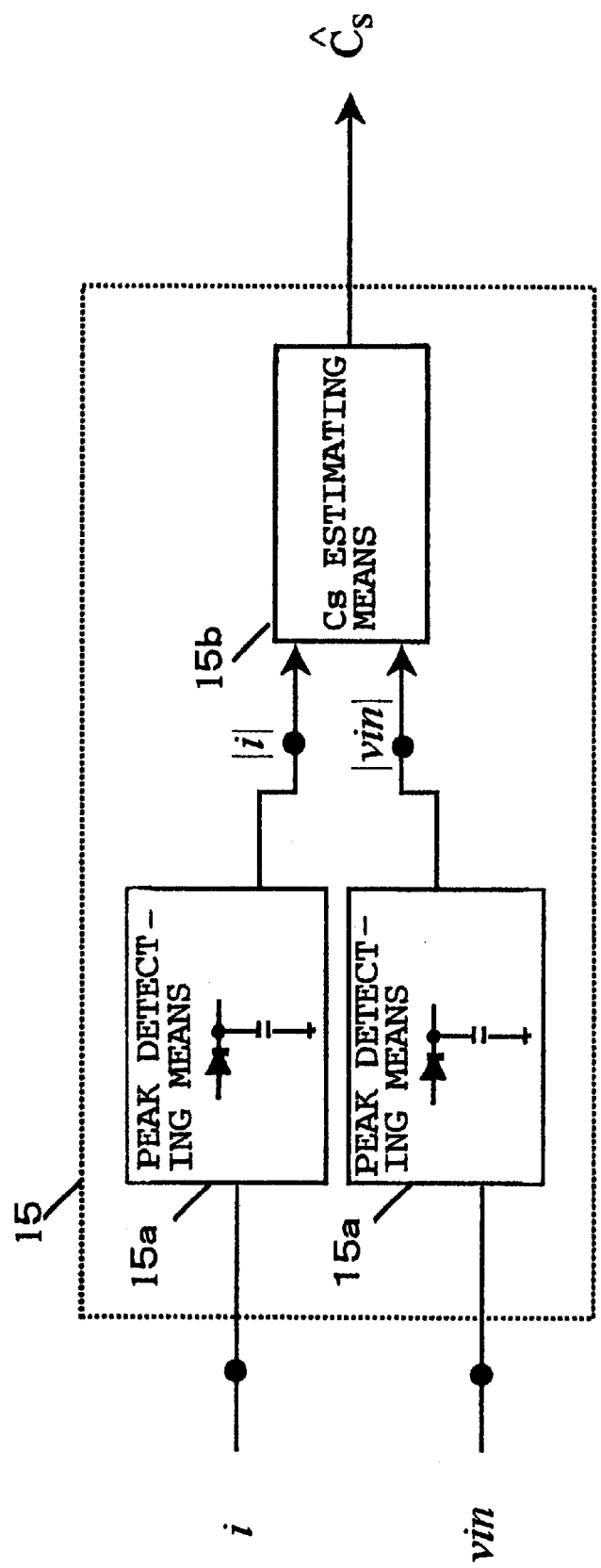
FIG. 13 is a configuration of the electric leak detecting apparatus of the present invention in another embodiment, which uses the AC method.

FIGS. 12 and 13 show means for estimating a floating capacitance Cs in another embodiment of the present invention. Although the floating capacitance Cs is already a known value measured by another means in the above embodiments, the floating capacitance Cs is estimated in this embodiment thereby to detect an electric leak more accurately. At first, the components of the estimating means will be described below. 15a is peak detecting means used to hold the peak values of both AC voltage and AC current. 15b is Cs estimating means used to estimate the floating capacitance Cs in accordance with (Expression 4). The computing means of the Cs estimating means 15b may be replaced with a reference table. 15 is means for estimating a floating capacitance. FIG. 13 shows a case in which vin is used.

From the AC signal source 1 a frequency f2 is output. The frequency f2 is higher than $f_1$. Consequently, 1/ (2 π f2cd) <<RLEAL is satisfied. The voltage |v| is thus regarded as a divided voltage obtained by Cd and Cs. At this time, when the AC current flowing in the system is assumed to be |i|, the Cs value is decided as follows:

$$\begin{cases} |i| = |Y||v| = 2\pi f_2 \frac{C_D C_S}{C_D + C_S}|v| \\ \therefore C_S = \frac{|i|C_D}{2\pi f_2 C_D|v| - |i|} \end{cases}$$

Consequently, in the present embodiment the floating capacitance Cs can be decided accurately thereby to improve the accuracy of the electric leak detection, although both condenser Cd and floating capacitance Cs were handled as known values in the processing for estimating a resistance component from an electric leak admittance in the previous embodiments.

Now as another embodiment of AC method in which the phase discriminating means is not used is described by using FIGS. 26 to 33. The 4f is a timing generating means which generates an edge output at zero-crossing from negative to positive of AC current flowing through the condenser 2, 4 g is sample/hold means which samples and holds a voltage of the AC source 1 according to the timing output from the timing generating means 4f. The 6e is a resistance component detecting means which detects a leak resistance GLEAK according to equation 10 by using the admittance |Y| from the admittance detecting means 5 and the reactance |x| from the sample/hold means 4 g.
[Equation 10]

$$\frac{1}{G_{LEAK}} = R_{LEAK} = \sqrt{\left|\frac{1}{Y_{LEAK}}\right|^2 - |X|^2}$$

The operation of this embodiment is follows. The voltage v of the AC source 1 which is sampled and held at the timing of the timing generating means 4f is divided by the amplitude of the AC signal, to obtain a reactance |X| of the condenser 2 and leak admittance 3b-2. The resistance detecting means 6e calculates the inverse of the leak resistance GLEAK according to the equation 10 from the reactance |X| and admittance |Y|. The comparing means 6b compares it with a threshold value to judge the leak state.

In the embodiment of FIGS. 26 to 33 the dividing means 5b can be omitted by making the effective value or peak value of the AC source 1 as a unit size.

Figure 25:
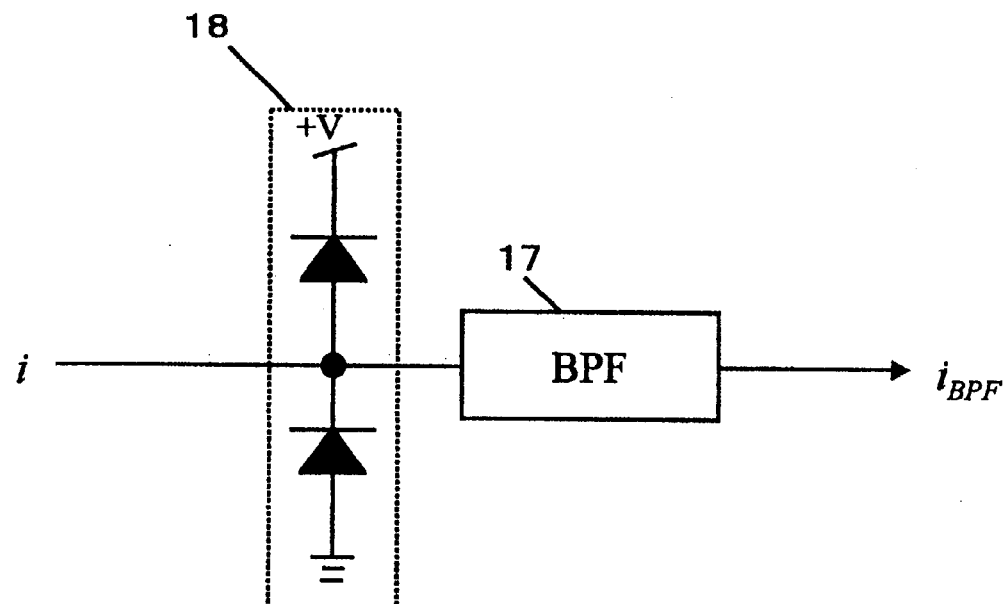
FIG. 25 is a configuration of a device for eliminating noise mixed in detecting voltage and current in an embodiment.
Figure 25:
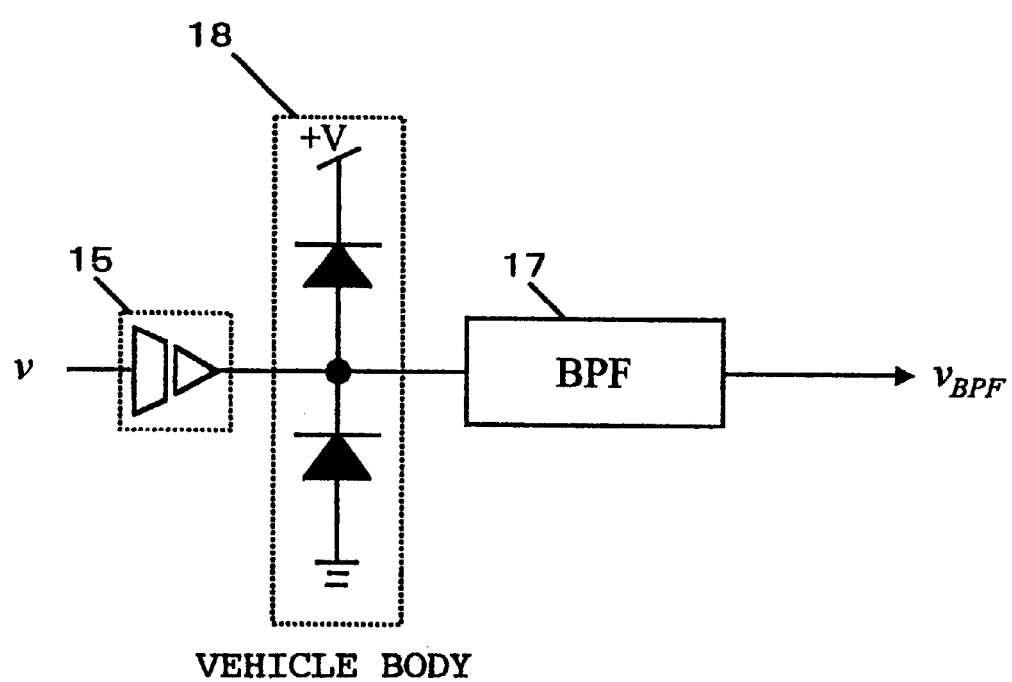
Figure 26:
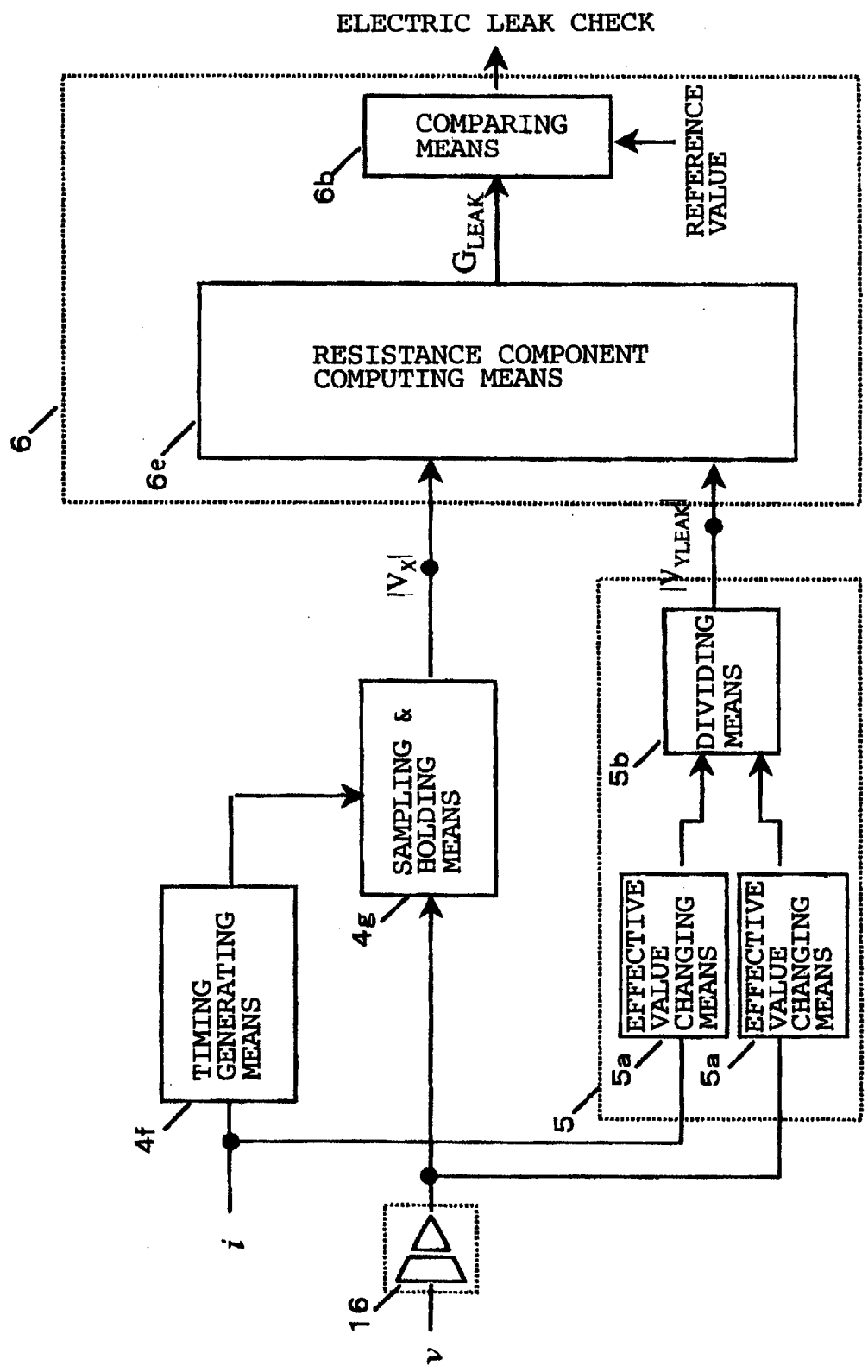
FIG. 26 is a configuration of the electric leak detecting apparatus of the present invention in another embodiment, which uses the AC method.
Figure 27:
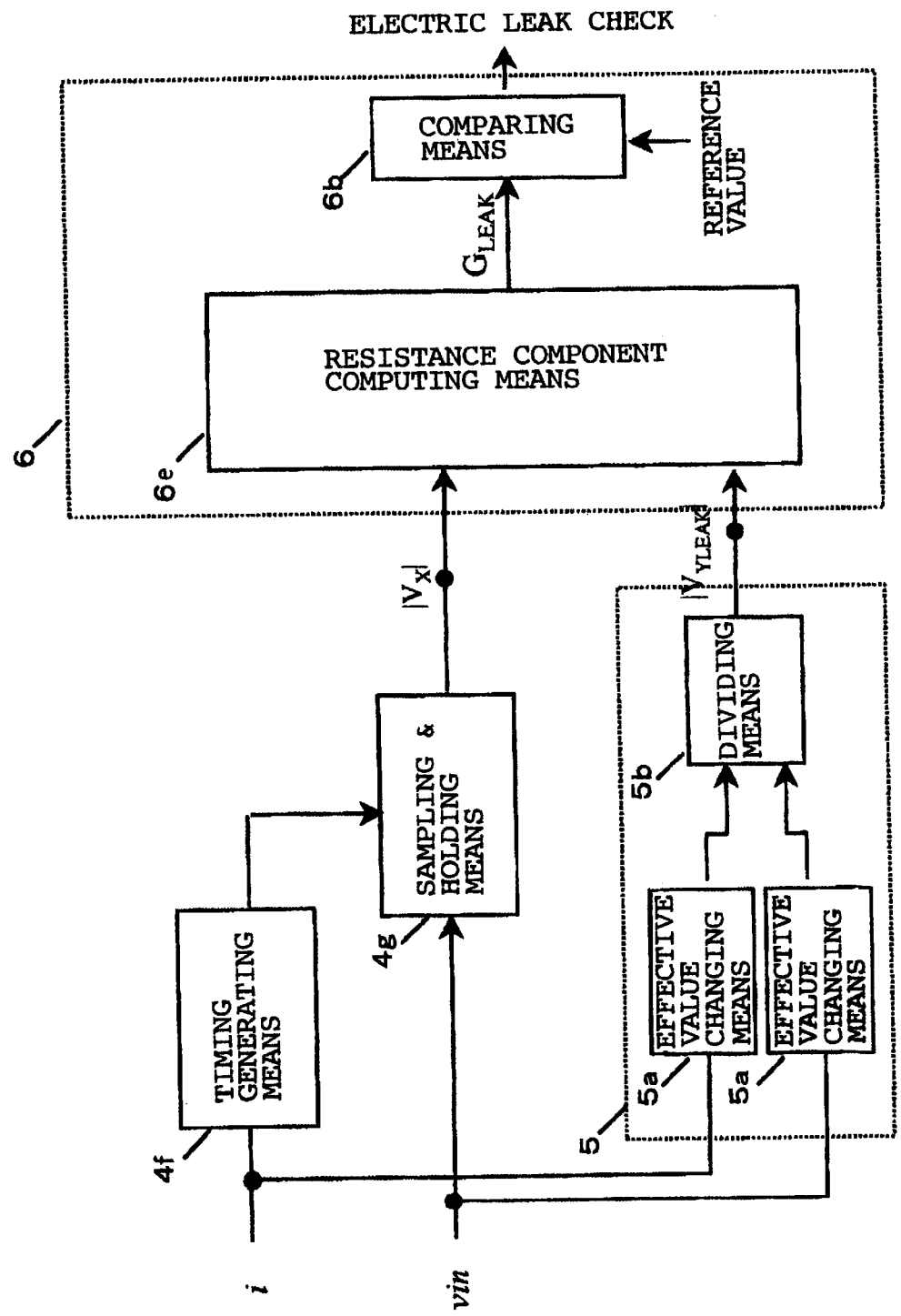
FIG. 27 a configuration of the electric leak detecting apparatus of the present invention in another embodiment, which uses the AC method.
Figure 28:
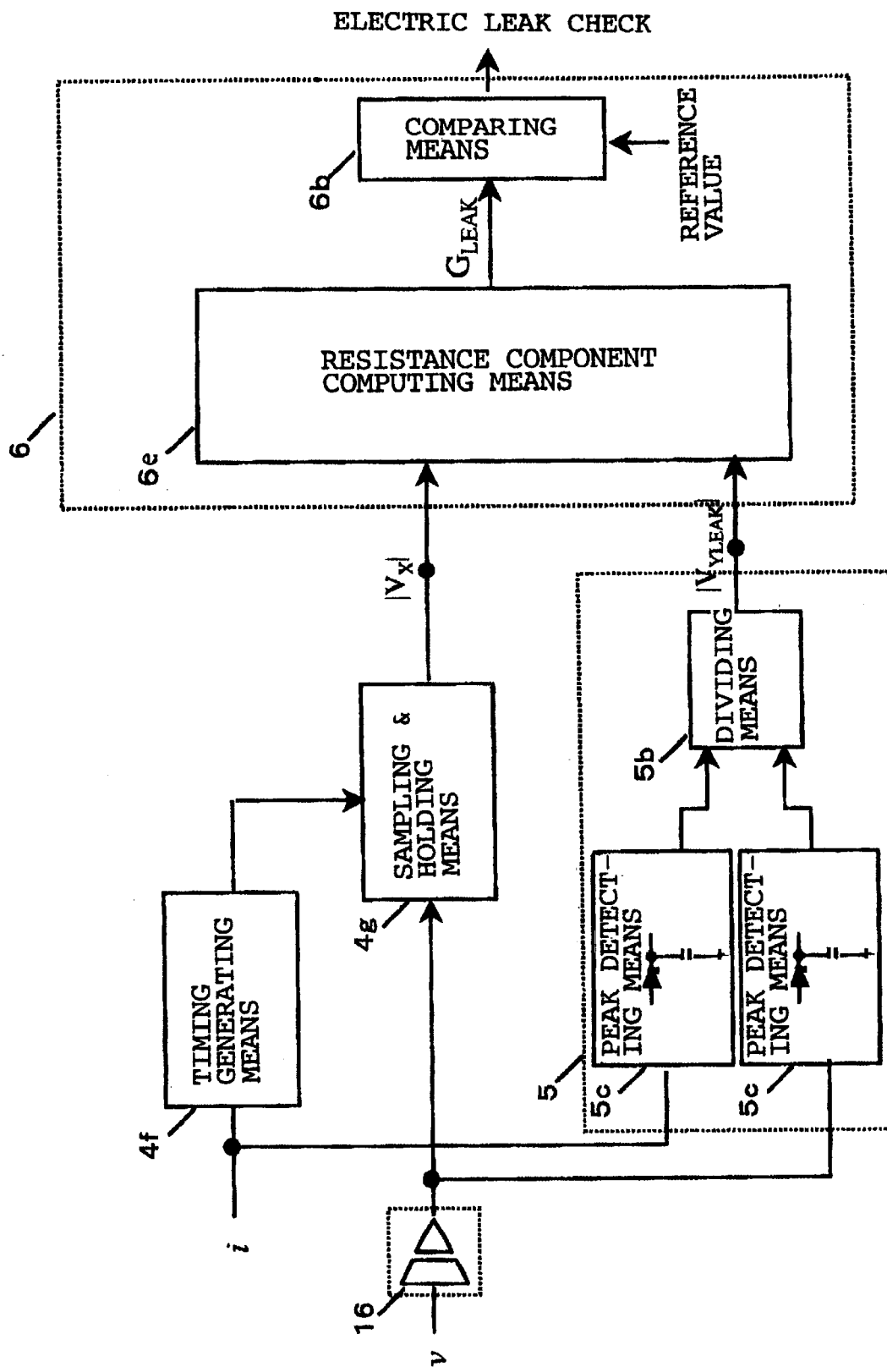
FIG. 28 is a configuration of the electric leak detecting apparatus of the present invention in another embodiment, which uses the AC method.
Figure 29:
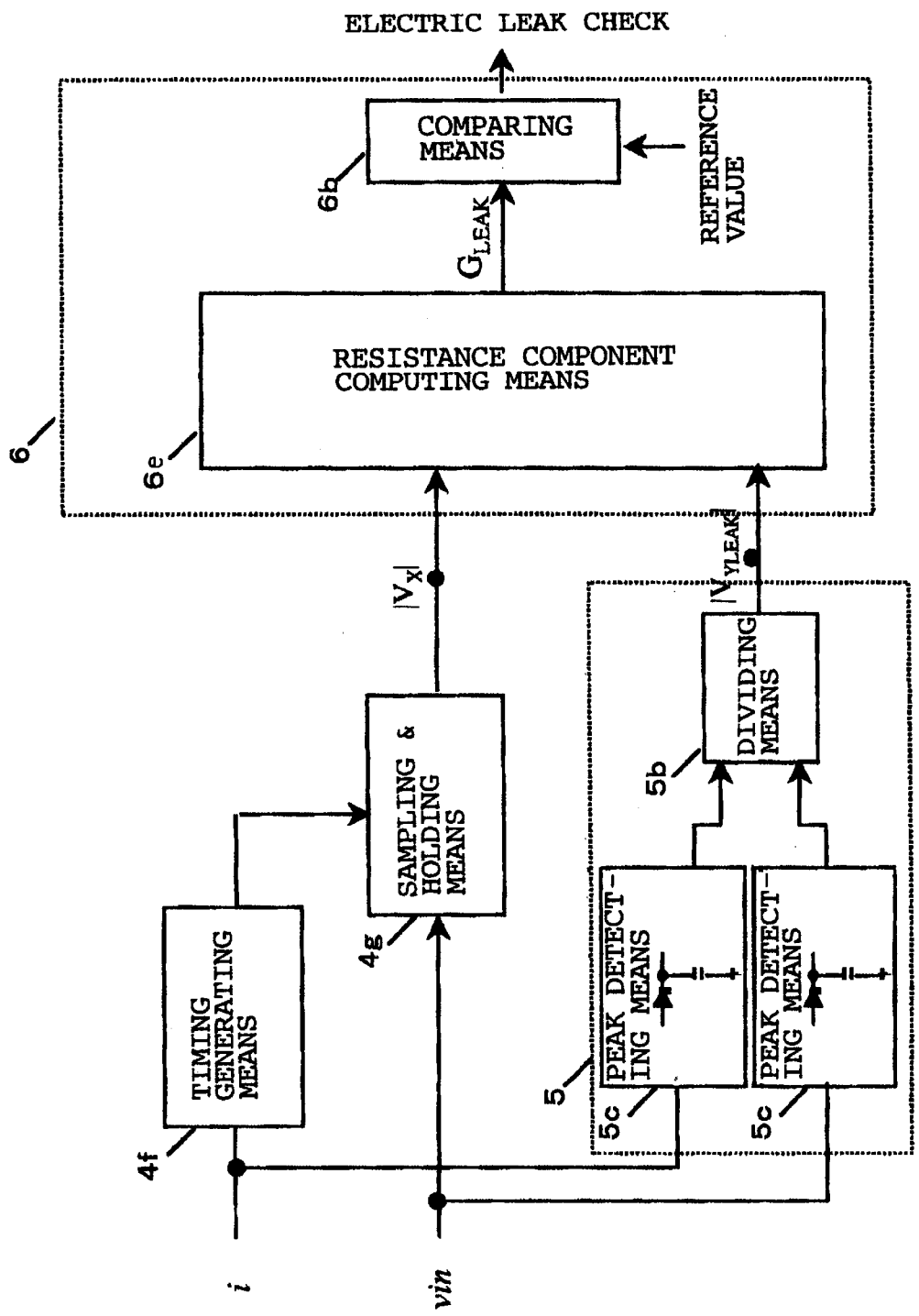
FIG. 29 a configuration of the electric leak detecting apparatus of the present invention in another embodiment, which uses the AC method.
Figure 30:
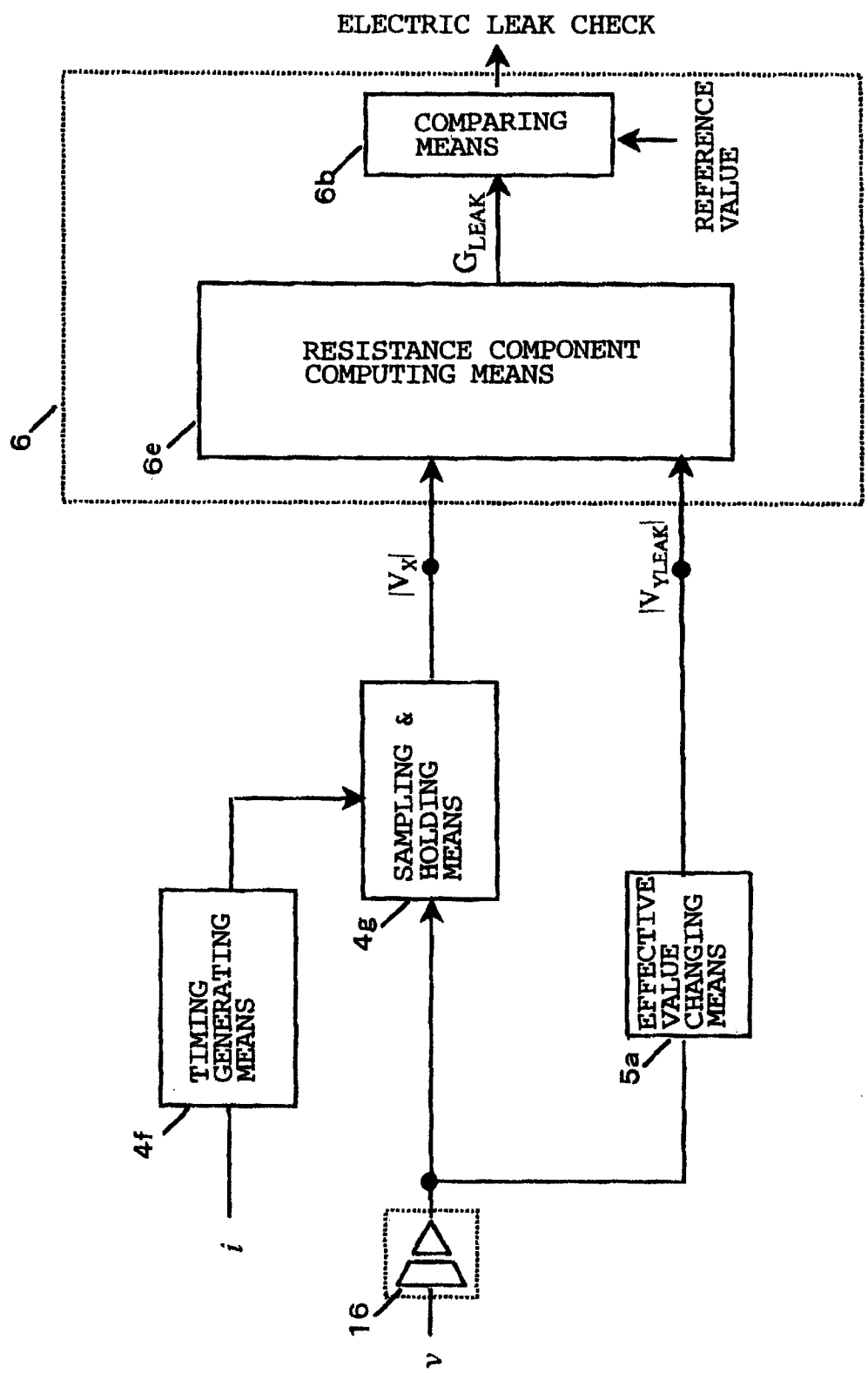
FIG. 30 is a configuration of the electric leak detecting apparatus of the present invention in another embodiment, which uses the AC method.
Figure 31:
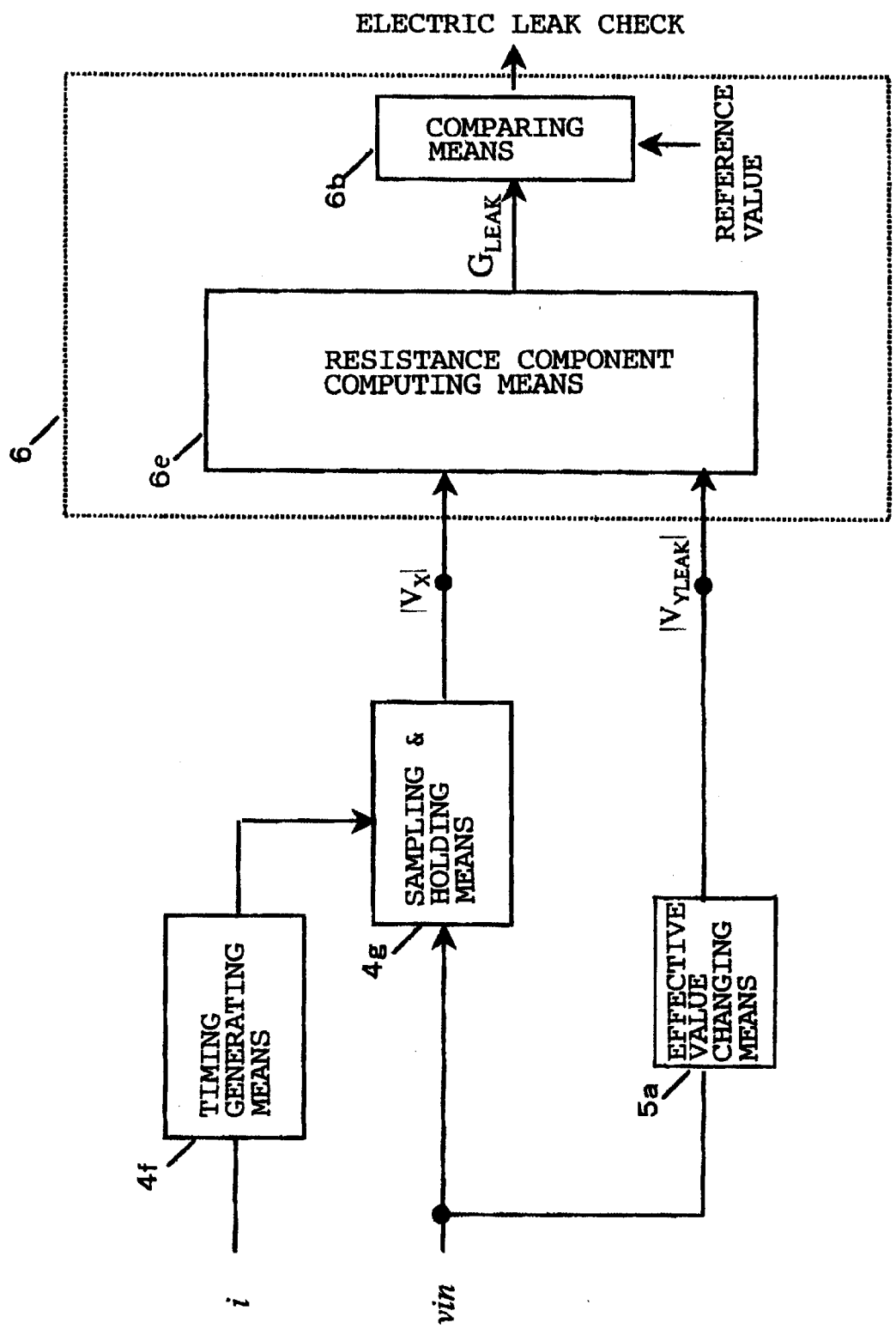
FIG. 31 a configuration of the electric leak detecting apparatus of the present invention in another embodiment, which uses the AC method.
Figure 32:
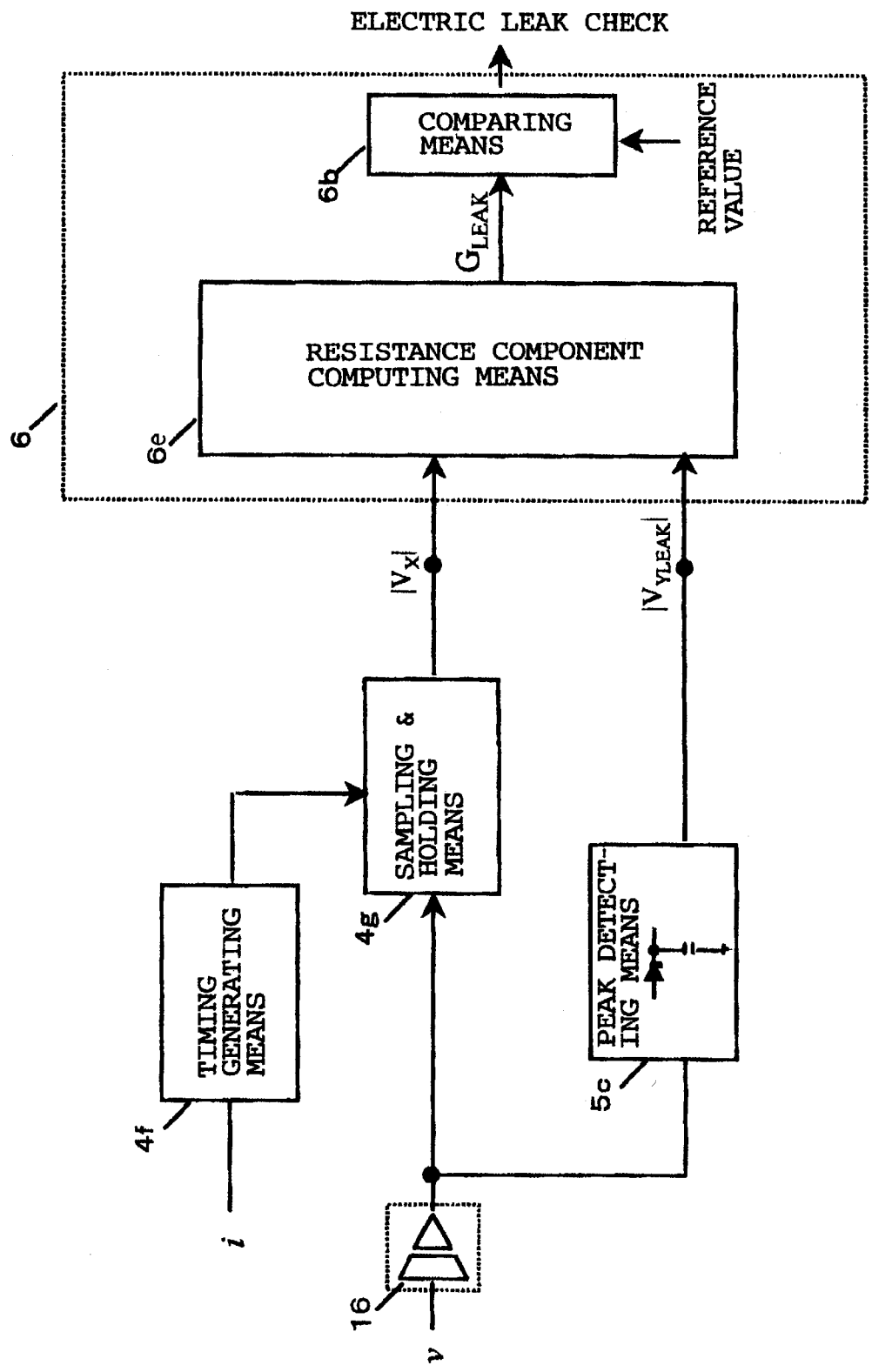
FIG. 32 is a configuration of the electric leak detecting apparatus of the present invention in another embodiment, which uses the AC method.
Figure 33:
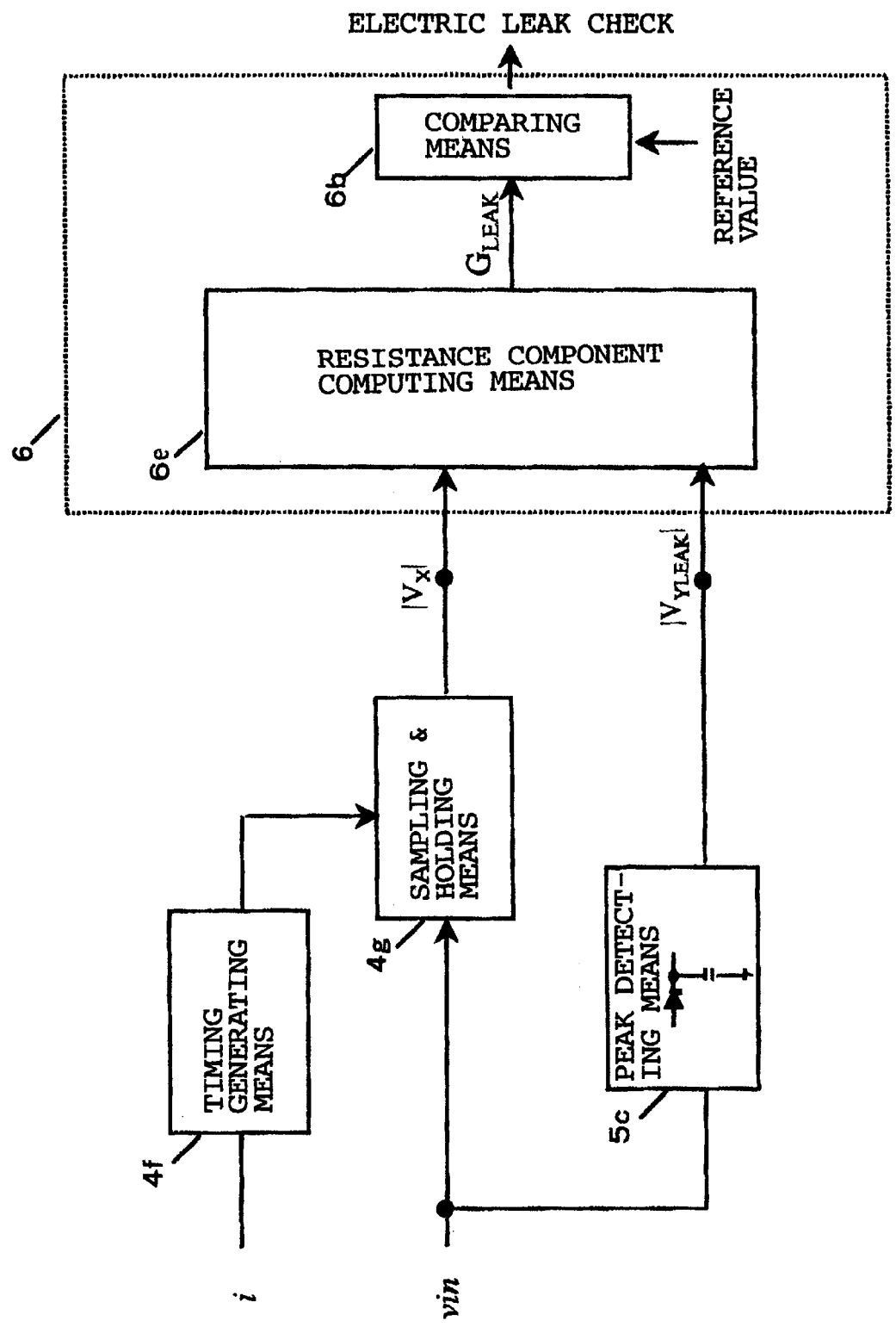
FIG. 33 a configuration of the electric leak detecting apparatus of the present invention in another embodiment, which uses the AC method.

According to the electric leak detecting described in the above-mentioned embodiments, it is premised that no noise is mixed in AC voltages v or vin, as well as in the current i. However, since an electric vehicle is provided with a driving power source such as an inverter motor, the inverter noise at the set battery is supplied to the side of the AC signal generating means 1, via the condenser 2. And, this noise damages an amplifying means provided at the AC signal generating means 1, as well as causes an error when detecting phase and admittance. Consequently, as shown in FIG. 25, such a damage of the amplifying means can be prevented by inserting a limiter 18 to cut the voltage level other than the range within +v of the vehicle body. Furthermore, as shown in FIGS. 1 to 13, it is possible to detect an electric leak accurately under such a noise in the circuits for detecting the current i and the voltage v by using a band-pass filter 17 which can cut noises in bands other than that of the detecting signal from the AC signal generating means 1. If a noise frequency band is close to a comparatively high frequency, the band-pass filter may be replaced with a low-pass filter.

Figure 14:
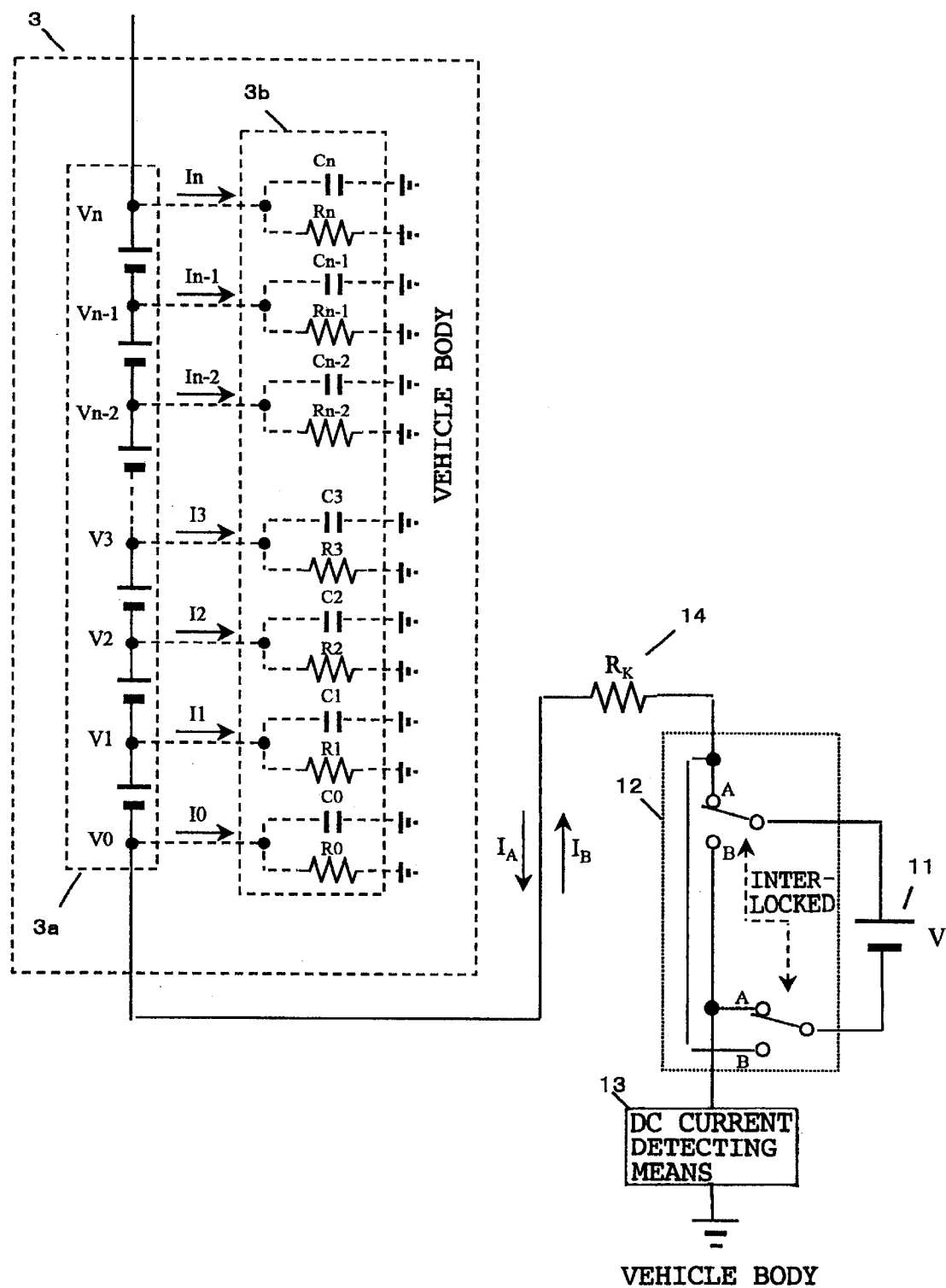
FIG. 14 is a configuration of the electric leak detecting apparatus of the present invention in another embodiment, which uses the DC method.

FIG. 14 shows a figuration of an electric leak detecting apparatus of the present invention, which adopts the DC method. At first, the components of the apparatus will be described below. 3 is a battery pack. 3a is n pieces of batteries disposed serially as described above. 3b is an electric leak admittance noted by a concentrated constant. 11 is a DC voltage source used to generate a DC voltage V. 12 is a polarity switch used to reverse the polarity of the DC voltage source 11 13 is means for detecting a DC current. 14 is a resistor whose value is a known RKΩ.

Next, the operation of the apparatus will be described. As shown in FIG. 14, the polarity switch 12 is turned to the A side, so that the voltage V from the DC voltage source 11 is connected to the minimum potential of set battery 3a. At this time, the circuit equation, if the number of batteries is n, is as shown in Equation 11.
[Equation 11]

$$\begin{cases} V = R_K I + V_1 + R_0 I_0 \\ \quad = R_K I + (V_1 + V_2) + R_2 I_2 \\ \quad \cdots \\ \quad = R_K I + (V_1 + V_n) + R_n I_n \\ I = I_0 + \Lambda + I_n \end{cases}$$

For example, when n=2, the current detecting means 13 measures the DC current IA as shown in Equation 12.
[Equation 12]

$$I_A = \frac{1}{\left\{1 + \frac{R_K}{(R_1 R_2 \mathbin{/\mkern-5mu/} R_2 R_0 \mathbin{/\mkern-5mu/} R_0 R_1)}\right\} R_0 R_1 R_2}$$

$$\{V(R_1 R_2 + R_2 R_0 + R_0 R_1) - R_0 R_2 V_0 - R_0 R_1 (V_0 + V_1)\}$$

Each double slash in the equation means a parallel connection of resistors.

After this, the polarity switch 12 is turned to the B side so that the voltage V from the DC voltage source 11 is connected to the minimum potential of the battery pack. At this time, the DC current IB measured by the current detecting means 13 is changed from V to −V so as to become as shown in Equation 13.

[Equation 13]

$$I_B = \cfrac{1}{\left\{1 + \cfrac{R_K}{(R_1R_2 \,/\!/\, R_2R_0 \,/\!/\, R_0R_1)}\right\}R_0R_1R_2} \{-V(R_1R_2 + R_2R_0 + R_0R_1) - R_0R_2V_0 - R_0R_1(V_0 + V_1)\}$$

Then, a difference between currents IA and IB is detected and when the difference is substituted for Equation 14, the result will become as shown in Equation 15.

$$\frac{2V}{I_A - I_B} \quad \text{[Equation 14]}$$

$$\begin{cases} \dfrac{2V}{I_A - I_B} = R_K + (R_1R_2 \,/\!/\, R_2R_0 \,/\!/\, R_0R_1) \\ \Theta(R_1R_2 \,/\!/\, R_2R_0 \,/\!/\, R_0R_1) = \dfrac{R_0R_1 + R_1R_2 + R_2R_0}{R_0 + R_1 + R_2} \end{cases}$$

V is thus eliminated. And, since the value of the resistor 14 is already known as RKΩ, the ohm value is subtracted to find the residual value as an electric leak resistance.

Although the voltage V of the DC voltage source 11 is applied to the minimum potential of the set battery 3a via the resistor 14 as shown in FIG. 14, the same electric leak resistance can also be obtained with the same computation as the above one even when the voltage V is applied to every node including the maximum potential 3a of the set battery 3a. This is because the internal resistance of the battery is much smaller than the electric leak resistance. Consequently, the DC method is not affected by the capacitance components C0 to Cn of an inverse number of the admittance as well as not affected by the voltage of the set battery. Furthermore, the current detecting means 13 in the circuit may be positioned anywhere in the system composed of the resistor 14, the DC voltage source 11, and the vehicle body. That is the position is not limited only at the position shown in FIG. 14 because the current detecting means 13 is just required to detect the current of the DC voltage source 11, which flows through the resistor 14.

Although n=2 is assumed in the above embodiment, the case under n=any natural number can be solved generally when IA and IB are obtained by solving the simultaneous equations in Equation 11.

The following is a listing of the terms appearing in equations (1) to (15) and their meanings:

Io–In are leak currents flowing from a node to the vehicle body.

A is a continuation of a series ( . . . )

Yo–Yn are admittance elements between the vehicle ground and the set battery.

YLEAK is the sum of the admittance elements.

Ro–Rn are resistive elements.

Co–Cn are capacitive elements.

GLEAK is 1/RLEAK which is the real component of the admittance.

jwCs is j2 πfCs which is the imaginary component of the admittance.

i is the ac current flowing into the vehicle body.

v is the ac voltage across the vehicle body.

f is frequency of the ac signal source.

Cs is the floating capacitance.

φ is the phase angle between the ac voltage v and the ac current i.

vin is the input ac voltage source.

CD is the capacitance between the ac signal source and the floating capacitance Cs.

What is claimed is:

1. An electric leak detecting apparatus used for an electric motorcar whose battery pack is insulated from the vehicle body with respect to direct currents, comprising:

first AC signal generating means for generating an AC signal, which supplies a sine wave detecting signal S1 of a single frequency $f_1$ to between said vehicle body and a low potential side or a high potential side of said battery pack;

a condenser having capacitance CD for insulating said first AC signal generating means from the low potential side or high potential side of said battery pack with respect to direct currents and for connecting said AC signal generating means to said low or high potential side of said battery pack with respect to alternating currents;

first voltage detecting means for detecting an AC signal voltage of said detecting signal S1 at either side of said condenser;

first current detecting means for detecting an AC signal current i of said detecting signal S1;

admittance detecting means for computing an electric leak admittance |Y| from the AC signal voltage and AC signal current i of said detecting signal S1;

phase discriminating means for finding a phase difference between the AC signal voltage and AC signal current i of said detecting signal S1;

resistance component detecting means for detecting a resistance component by computing a real part of said admittance |Y| from said admittance |Y| and said phase difference; and comparison means for comparing said resistance component with a predetermined threshold value used as an electric leak criterion.

2. An electric leak detecting apparatus as defined in claim 1, wherein said admittance detecting means computes said admittance |Y| by dividing an effective value of the amplitude of said current i by an effective value of the amplitude of said voltage.

3. An electric leak detecting apparatus as defined in claim 1, wherein said admittance detecting means computes said admittance |Y| by dividing a peak value of the amplitude of said current i with a peak value of the amplitude of said voltage.

4. An electric leak detecting apparatus used for an electric motorcar whose battery pack is insulated from the vehicle body with respect to direct currents, comprising:

first AC signal generating means for supplying a detecting signal S1 to between said vehicle body and the low potential side or high potential side of said battery pack, wherein said detecting signal S1 is a sine wave signal of a single frequency $f_1$ and is of v in amplitude, and an effective voltage value or a peak value of said detecting signal S1 is a unit voltage;

a condenser having a capacitance $C_D$ for insulating said AC signal generating means from the low potential side or high potential side of said battery pack with respect to direct currents and for connecting said AC signal generating means to the low potential side or high potential side of said battery pack with respect to alternating currents;

first voltage detecting means for detecting an AC signal voltage of said detecting signal S1 at either side of said condenser;

first current detecting means for detecting an AC signal current i of said detecting signal S1;

admittance detecting means for computing an electric leak admittance |Y| from an amplitude of the current i of said detecting signal S1;

phase discriminating means for finding a phase difference between the AC signal voltage and AC signal current i of said detecting signal S1;

resistance component detecting means for detecting a resistance component by computing a real part of said admittance |Y| from said admittance |Y| and said phase difference; and comparison means for comparing said resistance component with a predetermined threshold value used as an electric leak criterion.

5. An electric leak detecting apparatus used for an electric motorcar whose battery pack is insulated from the vehicle body with respect to direct currents, comprising:

first AC signal generating means for generating an AC signal, which supplies a sine wave detecting signal S1 of a single frequency $f_1$ to between said vehicle body and a low potential side or a high potential side of said battery pack;

a condenser having capacitance $C_D$ for insulating said first AC signal generating means from the low potential side or high potential side of said battery pack with respect to direct currents and for connecting said AC signal generating means to said low or high potential side of said battery pack with respect to alternating currents;

first voltage detecting means for detecting an AC signal voltage of said detecting signal S1 at either side of said condenser;

first current detecting means for detecting an AC signal current i of said detecting signal S1;

phase discriminating means for finding a phase difference between the AC signal voltage and AC signal current i of said detecting signal S1;

tangent detecting means for computing a tangent, tan φ, of said phase difference;

resistance component detecting means for detecting a resistance component by computing a real part of a leak admittance |Y| from the tangent, tan φ, by using $$|Y_{REAL}| = \frac{C_D\tan\phi + \sqrt{(C_D\tan\phi)^2 - 4\omega^2 C_S(C_S + C_D)}}{2}$$

, wherein Cs is a floating capacitance; and comparison means for comparing said resistance component with a predetermined threshold value used as an electric leak criterion.

6. An electric leak detecting apparatus as defined in claim 5, further including:

a second AC signal generating means for generating AC signal to supply a detecting signal S2, which is a sine wave signal of a single frequency $f_2$, to between said vehicle body and a low potential side or high potential side of said battery pack;

second voltage detecting means for detecting an AC signal voltage of said detecting signal S1 at either side of said condenser;

second current detecting means for detecting an AC signal current i of said detecting signal S1; and floating capacitance estimating means for estimating a floating capacitance Cs from the voltage, the current i, and said capacitance $C_D$ with respect to said detecting signal S2 by using $$\begin{cases} |i| = |Y||v| = 2\pi f_2 \frac{C_D C_S}{C_D + C_S}|v| \\ \therefore C_S = \frac{|i|C_D}{2\pi f_2 C_D |v| - |i|} \end{cases}$$

wherein said resistance component detecting means uses the estimated Cs to compute the real part of said admittance |Y|.

7. An electric leak detecting apparatus as defined in claim 1, wherein said resistance component detecting means includes means for computing and outputting a cosine, cos φ, of said phase difference and means for computing the real part of an admittance from said admittance |Y| and said cos φ by using R=|Y|cos φ.

8. An electric leak detecting apparatus as defined in claim 2, wherein said resistance component detecting means includes means for computing and outputting a cosine, cos φ, of said phase difference and means for computing the real part of an admittance from said admittance |Y| and said cos φ by using R=|Y|cos φ.

9. An electric leak detecting apparatus as defined in claim 3, wherein said resistance component detecting means includes means for computing and outputting a cosine, cos φ, of said phase difference and means for computing the real part of an admittance from said admittance |Y| and said cos φ by using R=|Y|cos φ.

10. An electric leak detecting apparatus as defined in claim 4, wherein said resistance component detecting means includes means for computing and outputting a cosine, cos φ, of said phase difference and means for computing the real part of an admittance from said admittance |Y| and said cos φ by using R=|Y|cos φ.

11. An electric leak detecting apparatus as defined in claim 5, wherein said resistance component detecting means includes means for computing and outputting a cosine, cos φ, of said phase difference and means for computing the real part of an admittance from said admittance |Y| and said cos φ by using R=|Y|cos φ.

12. An electric leak detecting apparatus as defined in claim 6, wherein
said resistance component detecting means includes means for computing and outputting a cosine, cos φ, of said phase difference and means for computing the real part of an admittance from said admittance |Y| and said cos φ by using R=|Y|cosφ.

13. An electric leak detecting apparatus used for an electric motorcar whose battery pack is insulated from the vehicle body with respect to direct currents, comprising:
first AC signal generating means for supplying a detecting signal S1 to between said vehicle body and the low potential side or high potential side of said battery pack, wherein said detecting signal S1 is a sine wave signal of a single frequency $f_1$ and is of v in amplitude;
a condenser having a capacitance $C_D$ for insulating said AC signal generating means from the low potential side or high potential side of said battery pack with respect to direct currents and for connecting said AC signal generating means to the low potential side or high potential side of said battery pack with respect to alternating currents;
first current detecting means for detecting an AC signal current i of said detecting signal S1;
admittance detecting means for computing an electric leak admittance |Y| from the voltage v and the current i of said detecting signal S1;
timing generating means for generating a timing synchronous to a zero-crossing of negative to positive in the current i of the detecting signal S1;
sampling means for sampling the voltage of the first AC signal generating means synchronous to the timing signal from the timing generating means, thereby to get a reactance component |X|;
resistance component detecting means for detecting a resistance component by computing a real part of said admittance |Y| from said admittance |Y| and said reactance component |X|, and
comparison means for comparing said resistance component with a predetermined threshold value used as an electric leak criterion.

14. An electric leak detecting apparatus as defined in claim 13, wherein
said admittance detecting means calculates the admittance |Y| by dividing an effective value of the amplitude of the current i with an effective value of the amplitude of the voltage.

15. An electric leak detecting apparatus as defined in claim 13, wherein
said admittance detecting means calculates the admittance |Y| by dividing a peak value of the amplitude of the current i with a peak value of the amplitude of the voltage.

16. An electric leak detecting apparatus as defined in claim 1, wherein
said voltage detecting means detects an AC signal voltage v at such side of said condenser on said battery pack side and said detected AC signal voltage v is entered to both said phase difference discriminating means and said admittance detecting means via an isolation amplifying circuit.

17. An electric leak detecting apparatus as defined in claim 1, wherein
said voltage detecting means detects an AC signal voltage vin at such side of said condenser on said AC signal generating means side and said detected AC signal voltage vin is entered to both said phase discriminating means and said admittance detecting means.

18. An electric leak detecting apparatus as defined in claim 4, wherein
said voltage detecting means detects an AC signal voltage v at such side of said condenser on said battery pack side, and said detected AC signal voltage v is entered to said phase discriminating means via an isolation amplifying circuit.

19. An electric leak detecting apparatus as defined in claim 5, wherein
said voltage detecting means detects an AC signal voltage v at such side of said condenser on said battery pack side, and said detected AC signal voltage v is entered to said phase discriminating means via an isolation amplifying circuit.

20. An electric leak detecting apparatus as defined in claim 4, wherein
said voltage detecting means detects an AC signal voltage vin at such side of said condenser on said AC signal generating means side, and said detected AC signal voltage vin is entered to said phase discriminating means.

21. An electric leak detecting apparatus as defined in claim 5, wherein
said voltage detecting means detects an AC signal voltage vin at such side of said condenser on said AC signal generating means side, and said detected AC signal voltage vin is entered to said phase discriminating means.

22. An electric leak detecting apparatus, comprising:
a battery pack insulated from the vehicle body;
a resistor connected to a node in said battery pack and having a known value;
a DC power source connected to between said resistor and a ground of said vehicle body and enabled for reversing a polarity; and
current detecting means for detecting a current flowing in a system composed of said DC voltage source, said resistor, and an electric leak resistor, wherein
an electric leak is detected by getting an electric leak resistance between said vehicle body and said battery pack.

23. In an electric vehicle having a battery pack insulated from and leaking current to the vehicle body, a method for detecting a leak comprising the steps of:
generating a signal having an AC sinusoidal voltage level and an AC sinusoidal current level between the battery pack and the vehicle body,
calculating an admittance value from the AC sinusoidal voltage and AC sinusoidal current,
measuring a phase difference between the AC sinusoidal voltage and AC sinusoidal current,
computing a resistance component value from the admittance value and the phase difference,
comparing the resistance component value with a predetermined threshold value, and defining a leak when the resistance component value exceeds the predetermined threshold value.

24. In an electric vehicle having (1) a battery pack insulated from and leaking current to the vehicle body represented by an equivalent circuit of a floating capacitor in parallel with a resistor connected between the battery pack and the vehicle body, and (2) an isolation capacitor having one end connected in series with the equivalent circuit, a method for detecting a leak comprising the steps of:

generating a first signal between a further end of the isolation capacitor and the vehicle body, the first signal having a first AC sinusoidal voltage level and a first AC sinusoidal current level, generating a second signal between the further end of the isolation capacitor and the vehicle body, the second signal having a second AC sinusoidal voltage level and a second AC sinusoidal current level, and the second signal having a substantially lower frequency than the first signal, calculating a capacitance value for the floating capacitor from the first AC sinusoidal voltage level and the first AC sinusoidal current value, measuring a phase difference between the second AC sinusoidal voltage and the second AC sinusoidal current, calculating an admittance value from the second AC sinusoidal voltage and the second AC sinusoidal current, computing a resistance component value from the admittance value using the phase difference, comparing the resistance component value with a predetermined threshold value, and defining a leak when the resistance component value exceeds the predetermined threshold value.

* * * * *